(12) United States Patent
Horita et al.

(10) Patent No.: US 6,548,871 B1
(45) Date of Patent: *Apr. 15, 2003

(54) SEMICONDUCTOR DEVICE ACHIEVING REDUCED WIRING LENGTH AND REDUCED WIRING DELAY BY FORMING FIRST LAYER WIRING AND GATE UPPER ELECTRODE IN SAME WIRE LAYER

(75) Inventors: Katsuyuki Horita, Tokyo (JP); Takashi Kuroi, Tokyo (JP); Yasuyoshi Itoh, Tokyo (JP); Katsuomi Shiozawa, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/543,349

(22) Filed: Apr. 5, 2000

(30) Foreign Application Priority Data

Oct. 27, 1999 (JP) .......................................... 11-305108

(51) Int. Cl.$^7$ .......................... H01L 29/76; H01L 29/94; H01L 31/113; H01L 31/115; H01L 27/14

(52) U.S. Cl. ...................... 257/368; 257/382; 257/649; 257/760

(58) Field of Search .................................. 257/649, 382, 257/758, 760, 774, 776, 368, 369; 438/622, 624, 637, 672

(56) References Cited

U.S. PATENT DOCUMENTS

| | | | | |
|---|---|---|---|---|
| 5,936,300 A | * | 8/1999 | Sasada et al. | 257/632 |
| 6,163,067 A | * | 12/2000 | Inohara et al. | 257/635 |
| 6,207,987 B1 | * | 3/2001 | Tottori | 257/306 |

FOREIGN PATENT DOCUMENTS

| | | |
|---|---|---|
| JP | 9-293862 | 11/1997 |
| JP | 11-26757 | 1/1999 |

OTHER PUBLICATIONS

U.S. patent application Ser. No. 09/543,349, filed Apr. 5, pending.*

U.S. patent application Ser. No. 09/615,711, filed Jul. 13, pending.*

U.S. patent application Ser. No. 09/401,849, filed Sep.22, pending.*

Atsushi Yagishita, et al., IEEE, IEDM, pp. 785–788, "High Performance Metal Gate MOSFETs Fabricated by CMP for 0.1 $\mu$m Regime", 1998.

* cited by examiner

Primary Examiner—Olik Chaudhuri
Assistant Examiner—Hoai Pham
(74) Attorney, Agent, or Firm—Oblon, Spivak, McClelland, Maier & Neustadt, P.C.

(57) ABSTRACT

Two source/drain regions (20) belonging to separate elements which are adjacent to each other are connected through a metal layer (14) having the same height as a height of a metal layer (10) forming a part of a gate electrode. In a manufacturing process, an insulating layer (8) is made of other material than and inserted between two insulating layers (7) and (16). The two insulating layers (7) and (16)function as molds for burying the metal layers (10), (14) and (15) therein and made of the same material. The metal layer (14) can therefore be formed at the same height as the height of the metal layer (10). Accordingly, portions to be connected through a wiring which are provided at a comparatively short distance are connected while reducing a wiring capacity.

8 Claims, 12 Drawing Sheets

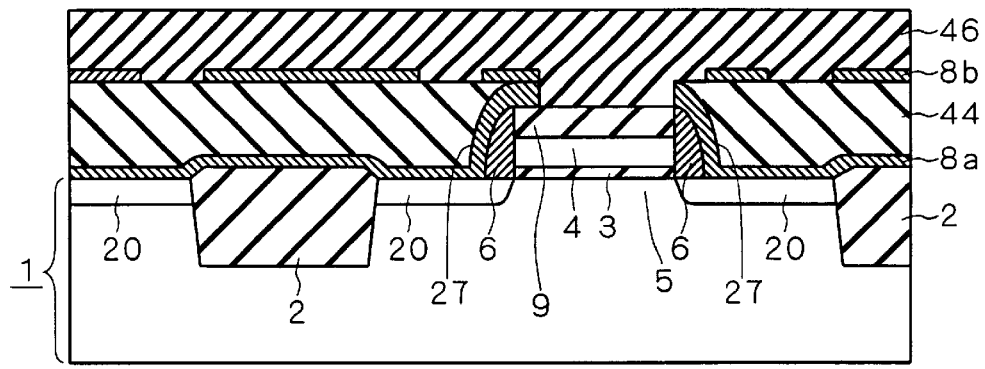
F I G. 16
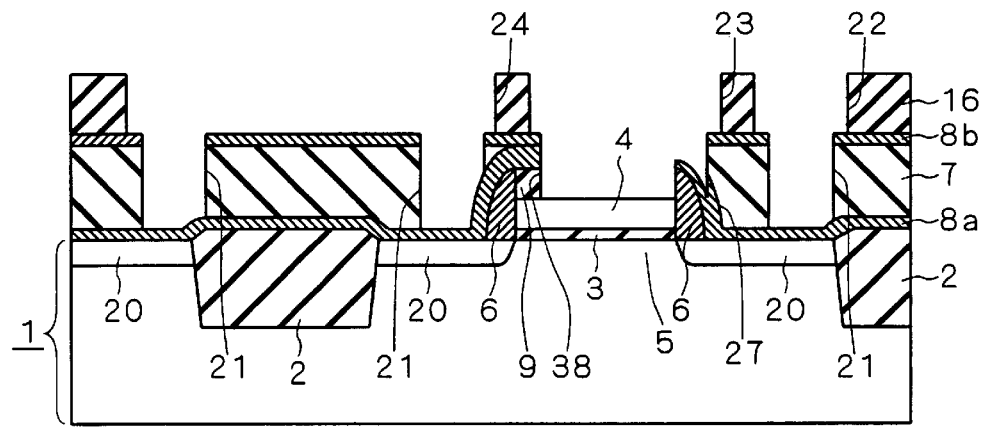
F I G. 17
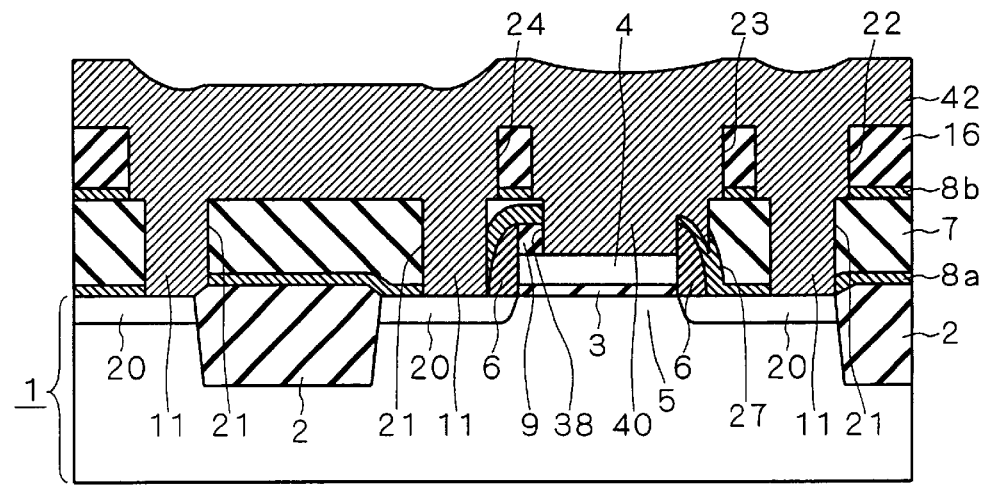
F I G. 18

US 6,548,871 B1

1

SEMICONDUCTOR DEVICE ACHIEVING REDUCED WIRING LENGTH AND REDUCED WIRING DELAY BY FORMING FIRST LAYER WIRING AND GATE UPPER ELECTRODE IN SAME WIRE LAYER

BACKGROUND OF THE INVENTION

1. Field of the Invention

The present invention relates to a semiconductor device having a MOS structure and a method of manufacturing the semiconductor device, and more particularly to an improvement for connecting portions provided at a comparatively short distance which are to be connected by a wiring while reducing a wiring capacity.

2. Description of the Background Art

First of all, terms used in this specification will be described. In the specification, "a MOS (Metal Oxide Semiconductor) FET" or "a MOS structure" widely includes those having a gate electrode constituted by a conductor other than metals following a custom of this field. In the specification, moreover, a set of "a source region" and "a drain region" will be referred to as "a source/drain region".

There has been known the fact that a lamination structure having a polysilicon film and a metal film is effectively used as a gate electrode in place of a conventional lamination structure having a polysilicon film and a metal silicide film in order to reduce a resistance of a gate electrode of a semiconductor element (for example, a MOSFET) having a MOS structure to implement a high-speed operation when a semiconductor integrated circuit is to be manufactured. However, in the case where a metal film is used for the gate electrode, the conditions of a heat treatment are restricted for reasons of a heat resistance after the gate electrode is formed. Accordingly, it is usually necessary to drop a heat treating temperature in the heat treatment of a source/drain region to be formed after the gate electrode is formed.

As a result, there has been a problem in that the source/drain region is insufficiently activated to raise a source/drain resistance, resulting in a reduction in the driving capability of the MOSFET. Furthermore, also in the case where a tantalum oxide film is used for a gate insulating film, for example, the restrictions on the heat resistance are not removed but the same problem related to the source/drain resistance arises. In order to solve the problem, there has been proposed a method for forming a dummy gate electrode to form a source/drain before a gate electrode is formed.

As an example, FIGS. 19 to 26 show a semiconductor device and a method of manufacturing the semiconductor device which have been disclosed in the Document "Ext. Abst. of International Electron Devices Meeting (1998) pp. 785 to 788". A semiconductor device 151 having a sectional structure shown in FIGS. 19 and 20 comprises a MOSFET having a metal gate electrode constituted by a replace method using a dummy gate electrode. FIG. 19 illustrates a sectional structure taken along a cutting line A—A or a cutting line B—B in FIG. 20.

In the semiconductor device 151, a plurality of element regions are set in a main surface of a semiconductor substrate 51 made of single crystal silicon and a MOSFET is built in each of the element regions. An element isolating film 52 is selectively formed as a trench type element isolating region in an area between the element regions in the main surface of the semiconductor substrate 51. The

2 semiconductor substrate 51 and the element isolating film 52 are covered with an insulating layer 57 acting as a mold.

Openings 71 and 72 penetrating from an upper surface to a lower surface are selectively provided on the insulating layer 57. A gate insulating film 53 is formed on a portion in the main surface of the semiconductor substrate 51 which is surrounded by the opening 71, and a gate electrode 61 is provided on the gate insulating film 53 to fill in the opening 71. A gate electrode 65 is buried in the opening 72 formed on the element isolating film 52. The gate electrodes 61 and 65 are formed of the same metal.

For each of the element regions, the semiconductor substrate 51 is provided with a channel region 55 selectively exposed to the main surface and a pair of source/drain regions 70 (or 70a) selectively exposed to the main surface with the channel region 55 interposed therebetween. The channel region 55 is opposed to the gate electrode 61 (or 65) through the gate insulating film 53. Moreover, the gate insulating film 53 and the element isolating film 52 are connected integrally with each other. The gate electrodes 61 and 65 are provided across both of the gate insulating film 53 and the element isolating film 52.

The insulating layer 57 and the gate electrodes 61 and 65 are covered with an upper insulating layer which is not shown. The source/drain regions 70 and 70a and the gate electrodes 61 and 65 are connected to an upper wiring layer (not shown) through a contact hole 75 which is selectively provided in the upper insulating layer.

FIGS. 21 to 26 are views showing the steps of a method of manufacturing the semiconductor device 151. In order to manufacture the semiconductor device 151, first of all, the step of FIG. 21 is executed. At the step of FIG. 21, a semiconductor substrate 51 made of single crystal silicon which has a main surface is first prepared. Next, a trench type element isolating film 52 is selectively formed in the main surface of the semiconductor substrate 51. The element isolating film 52 is an insulating film for isolating elements. Then, boron ions are implanted into the main surface of the semiconductor substrate 51. Consequently, a well is formed and doping for threshold voltage regulation is carried out at the same time.

At the step of FIG. 22, subsequently, a thermal oxidation treatment is first carried out. Consequently, an insulating film 82 which is a silicon oxide film is formed on the main surface of the semiconductor substrate 51. Then, a polysilicon film and a silicon nitride film are deposited on the insulating film 82 and the element isolating film 52 by using a CVD (Chemical Vapor Deposition) method. Next, the polysilicon film and the silicon nitride film are subjected to patterning by using photolithography and anisotropic etching. Consequently, a conductive layer 54 and an insulator 55 are formed. As will be described below, the conductive layer 54 and the insulator 55 serve as dummy gate electrodes.

At the step of FIG. 23, next, arsenic ions are selectively implanted into the main surface of the semiconductor substrate 51 by using the conductive layer 54 and the insulator 55 as shields. Consequently, a pair of source/drain regions 70 selectively exposed to the main surface are formed. A portion which is interposed between the pair of source/drain regions 70 and is selectively exposed to the main surface under the conductive layer 54 corresponds to a channel region 55.

At the step of FIG. 24, first of all, a heat treatment is carried out so that a dopant introduced into the source/drain region 70 is activated. Subsequently, the insulating film 82 is selectively removed to cause the portion provided under the conductive layer 54 to remain as a gate insulating film 83. Then, the CVD method is executed. Consequently, a silicon oxide film is deposited over the whole upper surface of a product obtained in this stage. Subsequently, a CMP (Chemical Mechanical Polishing) method is executed. Thus, the silicon oxide film is polished until an upper surface of the dummy gate electrode, that is, an upper surface of the insulator 55 is exposed. As a result, an insulating layer 57 having an upper surface flattened is formed as shown in FIG. 24. The insulating layer 57 selectively defines an opening 71. The conductive layer 54 and the insulator 55 are buried in the opening 71. An upper surface of the insulating layer 57 is arranged on a level with that of the insulator 55.

At the step of FIG. 25, subsequently, the conductive layer 54 and the insulator 55, that is, the dummy gate electrodes are removed. At this time, the gate insulating film 83 is simultaneously removed as shown in FIG. 25. The insulating layer 57 having the opening 71 cavitated serves as a mold.

At the step of FIG. 26, first of all, thermal oxidation is executed. Consequently, a gate insulating film 53 is formed as a silicon oxide film on a portion in the main surface of the semiconductor substrate 51 which is exposed to the opening 71. Then, tungsten is deposited to fill in the opening 71 and to cover the upper surface of the insulating layer 57 by using the CVD method or a sputtering method. As a result, a metal layer 60 is formed.

Thereafter, the CMP method is executed to flatten an upper surface of the metal layer 60. Consequently, the metal layer 60 is caused to remain as a gate electrode 61 only in the opening 71 of the insulating layer 57 acting as the mold. Thus, the structure shown in FIG. 19 is completed.

In order to implement a predetermined integrated circuit, it is necessary to selectively connect a plurality of gate electrodes 61 and 65 and a plurality of source/drain regions 70 and 70a. For this purpose, it is necessary to form a contact hole in a part corresponding to a portion provided over the gate electrode and the source/drain region which are to be connected in the insulating layer including the insulating layer 57 which is provided over the main surface of the semiconductor substrate 51 and to bury a wiring material in the contact hole, thereby performing a connection.

In the semiconductor device 151, however, a material and a height of an upper surface (that is, a distance from the main surface of the semiconductor substrate) is varied between the gate electrodes 61 and 65 and the source/drain regions 70 and 70a. Accordingly, it is necessary to provide the contact hole on a plurality of members having various materials and different heights of upper surfaces by using dry etching. However, such a technique has become more difficult with the progress of microfabrication of a semiconductor device in recent years.

In order to solve the above-mentioned problem, for example, Japanese Laid-Open Patent Publication No. 9-293862 has proposed a method for simultaneously forming a plug communicating with a source/drain region when removing a dummy gate electrode and forming a gate electrode by a metal layer, thereby making materials and heights of upper surfaces identical to each other between the plug and the gate electrode. In this method, a contact hole to be positioned above the gate electrode and the source/drain region can be formed on members having materials and heights of upper surfaces which are common. FIG. 27 is a sectional view showing a structure of a semiconductor device thus constituted.

Also in a semiconductor device 152 shown in FIG. 27, a plurality of element regions are set in a main surface of a semiconductor substrate 51 made of single crystal silicon in the same manner as the semiconductor device 151 and a MOSFET is built in each of the element regions. The arrangement of the element regions is illustrated in the same manner as in FIG. 20, for example. In the semiconductor device 152, gate electrodes 62 and 63 are buried in openings 71 and 72 provided in an insulating layer 57, respectively. Both the gate electrodes 62 and 63 constitute a lamination structure having a conductive layer 54 made of polysilicon and a metal layer 76 formed on the conductive layer 54.

Moreover, a side wall 56 is formed on side faces of each of the gate electrodes 62 and 63. The openings 71 and 72 also accommodate the side wall 56 therein. As will be described later, the insulating layer 57 and the side wall 56 function as molds in a manufacturing process.

Furthermore, the insulating layer 57 is selectively provided with an opening 73 penetrating from an upper surface to a lower surface over a source/drain region 70. A metal layer 78 made of the same material as a material of the metal layer 76 is buried in the opening 73. The metal layer 78 functions as a plug for electrically connecting the source/drain region 70 to other portions.

FIGS. 28 to 32 are views showing the steps of a method for manufacturing the semiconductor device 152. In order to manufacture the semiconductor device 152, first of all, the step of FIG. 21 is executed and the step of FIG. 28 is then executed. At the step of FIG. 28, a thermal oxidation treatment is first carried out. Consequently, an insulating film 88 which is a silicon oxide film is formed on a main surface of a semiconductor substrate 51. Then, a polysilicon film, a silicon oxide film and a polysilicon film are deposited on the insulating film 88 and an element isolating film 52 in this order by using a CVD method.

Next, these films are subjected to patterning by using photolithography and anisotropic dry etching. Consequently, a conductive layer 54, an insulator 59 and a conductive layer 86 which constitute a three-layer structure are formed. As will be described later, the insulator 59 and the conductive layer 86 serve as dummy gate electrodes. Then, impurity ions are selectively implanted into the main surface of the semiconductor substrate 51 by using the three-layer structure as a shield. Consequently, a pair of LDD (Lightly Doped Drain) regions (not shown) selectively exposed to the main surface are formed.

At the step of FIG. 29, first of all, the insulating film 88 is selectively removed to cause a portion provided under the conductive layer 54 to remain as a gate insulating film 53. Then, a side wall 56 is formed on a side face of the three-layer structure. Subsequently, arsenic ions are selectively implanted into the main surface of the semiconductor substrate 51 by using the three-layer structure and the side wall 56 as shields. Consequently, a pair of source/drain regions 70 are formed.

At the step of FIG. 30, next, the CVD method is executed to deposit a silicon oxide film over the whole upper surface of a product obtained in this stage. By executing a CMP method, subsequently, the silicon oxide film is polished until an upper surface of the dummy gate electrode, that is, an upper surface of the conductive layer 86 is exposed. As a result, an insulating layer 84 having an upper surface flattened is formed as shown in FIG. 30. The insulating layer 84 selectively defines openings 71 and 72. The conductive layer 54, the insulator 59 and the conductive layer 86 are buried in the openings 71 and 72. The upper surface of the insulating layer 84 is arranged on a level with that of the conductive layer 86.

At the step of FIG. 31, subsequently, the insulator 55 and the conductive layer 86, that is, the dummy gate electrodes are removed by dry etching or wet etching. At the same time, an opening 73 penetrating from an upper surface to a lower surface is selectively formed in a portion of an insulating layer 57 which is provided on the source/drain region 70. The insulating layer 57 having the opening 73 and the openings 71 and 72 from which the dummy gate electrodes are removed serves as a mold at the next steps.

At the step of FIG. 32, first of all, a titanium nitride film (not shown) is deposited as a barrier metal over the whole upper surface of a product obtained in this stage. Then, tungsten is deposited on the barrier metal by using a CVD method. Consequently, a metal layer 60 is formed. The metal layer 60 is formed to fill in the openings 71, 72 and 73 and to cover an upper surface of the insulating layer 57.

Then, the CMP method is executed to flatten an upper surface of the metal layer 60. As a result, the metal layer 60 is caused to remain as a metal layer 76 or 78 only in the openings 71, 72 and 73 of the insulating layer 57 acting as the mold. Thus, the structure shown in FIG. 27 is completed.

As shown in FIG. 27, in the semiconductor device 152, upper surfaces of gate electrodes 62 and 63 and an upper surface of the metal layer 78 acting as a plug which is positioned on the source/drain region 70 have the same height from the main surface of the semiconductor substrate 51 and are formed of the same metallic material. Accordingly, a difficulty in forming a contact hole which has been a trouble of the semiconductor device 151 can be eliminated.

However, the semiconductor device 152 is similar to the semiconductor device 151 in that a plurality of portions such as a plurality of gate electrodes, plural pairs of source/drain regions and the like should be selectively connected through a wiring material buried in a contact hole 75 as shown in FIG. 33 in order to implement a predetermined integrated circuit. For this reason, portions which are mutually positioned at a short distance have also been connected in a bypassing configuration through the wiring material buried in the contact hole 75 and a first wiring layer M1 positioned on a first layer (a lowermost layer). Consequently, there has been a problem in that a useless wiring delay is caused, resulting in a considerable delay on signal propagation.

In such a semiconductor device as to provide a DRAM having a high density and a mass storage capacity in the same semiconductor substrate, a height of a capacitor from the semiconductor substrate is set large in order to keep a capacity of the capacitor equal to or larger than a certain capacity. Consequently, an insulating layer provided between a wiring layer and the semiconductor substrate is set thick. As a result, a contact hole is provided deeply in the insulating layer. In such a semiconductor device, portions which are mutually positioned at a short distance are effectively connected through a remarkably long wiring. Consequently, a great wiring delay is particularly caused.

In recent years, furthermore, an integrated circuit has become complicated with an enhancement in functionality of a semiconductor device. As a result, multilayered wiring layers M1 to M5 have been used as illustrated in FIG. 33. Consequently, there has been a problem in that a manufacturing cost is increased.

If separate portions can be connected to each other at a height of a metal layer included in a gate electrode, both the problems of the wiring delay and the high cost caused by the multilayered interconnection can be eliminated at the same time. However, even if this is to be realized within the prior art, a gate electrode 65 is only extended over the source/drain region 70 together with a gate insulating film and a connection between the gate electrode 65 and the source/drain region 70 without a contact hole and the like cannot be achieved as shown in FIG. 34 illustrating an example of the semiconductor device 151.

SUMMARY OF THE INVENTION

In order to solve the above-mentioned problems of the conventional device, it is an object of the present invention to obtain a semiconductor device capable of reducing a wiring delay to suppress a signal delay and decreasing the number of wiring layers to reduce a manufacturing cost, and to provide a method suitable for manufacturing the semiconductor device.

In the same manner as in the above-mentioned Japanese Laid-Open Patent Publication No. 9-293862, there has been known Japanese Laid-Open Patent Publication No.11-26757 as a document which has disclosed a technique for forming a plug communicating with a source/drain region simultaneously with the formation of a gate electrode by a metal layer.

A first aspect of the present invention is directed to a semiconductor device comprising a semiconductor substrate defining a main surface, the semiconductor substrate including a channel region selectively exposed to the main surface for each of a plurality of element regions set along the main surface, and a pair of source/drain regions selectively exposed to the main surface with the channel region interposed therebetween, and the semiconductor device further comprising an insulating film selectively provided on the main surface and including a gate insulating film provided on the channel region for each of the element regions, a conductive layer provided on the insulating film, a first insulating layer which has a first opening divided into a plurality of portions and penetrating from an upper surface to a lower surface by accommodating the conductive layer and being selectively opened over the pair of source/drain regions for each of the element regions and which covers the main surface and the insulating film, a second insulating layer provided on the first insulating layer and formed of a material different from a material of the first insulating layer for selectively defining a second opening penetrating from an upper surface to a lower surface to communicate with the first opening, a third insulating layer provided on the second insulating layer and formed of a material different from a material of the second insulating layer for selectively defining a third opening which is opened to include the second opening and penetrates from an upper surface to a lower surface to cause at least one set included in the mutually separated portions of the first opening to communicate with each other, and a metal layer buried in the first to third openings together with the conductive layer.

A second aspect of the present invention is directed to the semiconductor device according to the first aspect of the present invention, further comprising a fourth insulating film which is provided under the first insulating layer, selectively defines a fourth opening formed under the first opening and having the conductive layer and the metal layer buried therein and is formed of a material different from materials of the first and third insulating layers.

A third aspect of the present invention is directed to the semiconductor device according to the first or second aspect of the present invention, wherein the first insulating layer and the third insulating layer are formed of the same material.

A fourth aspect of the present invention is directed to a method of manufacturing a semiconductor device, comprising the steps of (a) preparing a semiconductor substrate defining a main surface, (b) forming an insulating film on the main surface, (c) depositing a conductive material to cover the insulating film, (d) patterning the conductive material, thereby selectively causing the conductive material to remain as a conductive layer to include a portion positioned above a channel region which is selectively set for each of a plurality of element regions set along the main surface, (e) selectively introducing an impurity into the main surface by using the conductive layer as a shield, thereby forming a pair of source/drain regions which are selectively exposed to the main surface with the channel region interposed therebetween for each of the element regions, (f) selectively removing a portion of the insulating film which is not covered with the conductive layer but is exposed in each of the element regions before the step (e) or after the step (e), (g) depositing a first insulating layer to cover the main surface, the insulating film and the conductive layer, (h) polishing the first insulating layer, thereby flattening an upper surface of the first insulating layer, (i) depositing a material which is different from a material of the first insulating layer to cover the first insulating layer and the conductive layer, thereby forming a second insulating layer, (j) patterning the second insulating layer, thereby forming a first opening which is divided into a plurality of portions to be selectively opened above the conductive layer and the pair of source/drain regions for each of the element regions and penetrates from an upper surface to a lower surface, (k) depositing a material which is different from a material of the second insulating layer to cover the first and second insulating layers and the conductive layer, thereby forming a third insulating layer after the step (j), (l) executing etching having etching selectivity for the first and third insulating layers against the second insulating layer and the conductive layer, thereby selectively forming, in the third insulating layer, a second opening penetrating from an upper surface to a lower surface to include the first opening and to connect at least one set contained in the portions of the first opening which are separated from each other, and selectively forming, in the first insulating layer, a third opening penetrating from an upper surface to a lower surface under the first opening, (m) depositing a metal layer to fill in the first to third openings and to cover an upper surface of the third insulating layer, and (n) polishing the metal layer until the third insulating layer is exposed.

A fifth aspect of the present invention is directed to the method of manufacturing a semiconductor device according to the fourth aspect of the present invention, further comprising the step of (c1) depositing, on the conductive material, an insulating material which is different from the material of the second insulating layer after the step (c) and before the step (d), the step (d) including the steps of (d-1) patterning the insulating material, thereby causing the insulating material to selectively remain as an insulator, and (d-2) performing selective etching by using the insulator as a shield, thereby forming the conductive layer, at the step (e), the insulator being also used as the shield together with the conductive layer, at the step (g), the first insulating layer being deposited to cover the insulator in addition to the main surface, the insulating film and the conductive layer, at the step (i), the second insulating layer being formed to cover the insulator in addition to the first insulating layer and the conductive layer, at the step (k), the third insulating layer being formed to cover the insulator in addition to the first and second insulating layers and the conductive layer, at the step (l), as said etching, etching having etching selectivity for the first and third insulating layers and the insulator against the second insulating layer being executed, thereby selectively forming, in the insulator, a fourth opening penetrating from an upper surface to a lower surface under the first opening in addition to the selective formation of the third opening on the first insulating layer, and at the step (m), the metal layer being deposited to fill in the fourth opening in addition to the first to third openings.

A sixth aspect of the present invention is directed to the method of manufacturing a semiconductor device according to the fourth or fifth aspect of the present invention, further comprising the step of (f1) depositing an insulating material different from materials of the first and third insulating layers to cover the main surface, the insulating film and the conductive layer, thereby forming a fourth insulating layer after the step (f) and before the step (g), at the step (g), the first insulating layer being deposited to cover the fourth insulating layer in addition to the main surface, the insulating film and the conductive layer, at the step (h), the polishing being executed until the fourth insulating layer is exposed, at the step (i), the second insulating layer being formed to cover the fourth insulating layer in addition to the first insulating layer and the conductive layer, at the step (j), the patterning being performed including a portion of the fourth insulating layer which is provided in contact with the second insulating layer, and at the step (k), the third insulating layer being formed to cover the fourth insulating layer in addition to the first and second insulating layers and the conductive layer, and the manufacturing method further comprising the step of (l1) selectively removing an exposed portion of the fourth insulating layer after the step (l).

A seventh aspect of the present invention is directed to the method of manufacturing a semiconductor device according to any of the fourth to sixth aspects of the present invention, wherein the first insulating layer and the third insulating layer are formed of the same material.

According to the first aspect of the present invention, the third opening defined by the third insulating layer is formed to cause at least one set of the portions included in the first opening and separated from each other to communicate with each other. Therefore, the metal layer which is buried in the third opening and also forms the gate electrode serves as a lowermost wiring layer. Consequently, it is possible to obtain an effect that a wiring delay can be reduced and the number of the wiring layers can be decreased resulting in a reduction in a manufacturing cost, due to the connection of close portions through an effectively short wiring, which have not been obtained by the technique disclosed in the Japanese Laid-Open Patent Publications Nos. 9-293862 or 11-26757.

According to the second aspect of the present invention, the fourth insulating layer is provided under the first insulating layer. Therefore, the fourth insulating layer can be used as an etching stopper when the first opening is to be formed in the first insulating layer in the manufacturing process. Consequently, it is possible to prevent a defective junction and the like from being caused by the inadvertent removal of a part of the insulating film even if a mask alignment makes errors.

According to the third aspect of the present invention, the first and third insulating layers are formed of the same material. Therefore, the opening can easily be formed in both of the first and third insulating layers at the same etching step. More specifically, the manufacturing process can further be simplified and a product can further be made inexpensive.

According to the fourth aspect of the present invention, the first opening is formed in the second insulating layer to be selectively opened above the conductive layer and a pair of source/drain regions for each of the element regions, the second opening is selectively formed in the third insulating layer to connect at least one set of the portions included in the first opening and separated from each other and the third opening penetrating from the upper surface to the lower surface of the first insulating layer under the first opening is selectively formed in the first insulating layer. Furthermore, these openings are filled with the metal layer. Consequently, the metal layer which is buried in the second opening and also forms the gate electrode serves as a lowermost wiring layer. Accordingly, it is possible to obtain an effect that a wiring delay can be reduced and the number of the wiring layers can be decreased resulting in a reduction in a manufacturing cost, due to the connection of close portions through an effectively short wiring, which have not been obtained by the technique disclosed in the Japanese Laid-Open Patent Publications Nos. 9-293862 or 11-26757.

According to the fifth aspect of the present invention, the conductor is subjected to selective etching by using the insulator as the shield so that a conductive layer is formed. In other words, there is an advantage that the insulator can be utilized as a hard mask in the formation of the conductive layer.

According to the sixth aspect of the present invention, the fourth insulating layer is formed before the formation of the first insulating layer. Therefore, when the third opening is to be formed in the first insulating layer, the fourth insulating layer functions as an etching stopper. Consequently, it is possible to prevent a defective junction and the like from being caused by the inadvertent removal of a part of the insulating film even if a mask alignment makes errors.

According to the seventh aspect of the present invention, the first and third insulating layers are formed of the same material. Therefore, the second and third openings can be formed more efficiently at the same etching step.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 12 to 18 are views showing the steps of manufacturing the device according to the second embodiment;

DESCRIPTION OF THE PREFERRED EMBODIMENTS (1. First Embodiment)

First of all, a semiconductor device according to a preferred embodiment will be described below (1.1 Structure of Device)

Figure 1:
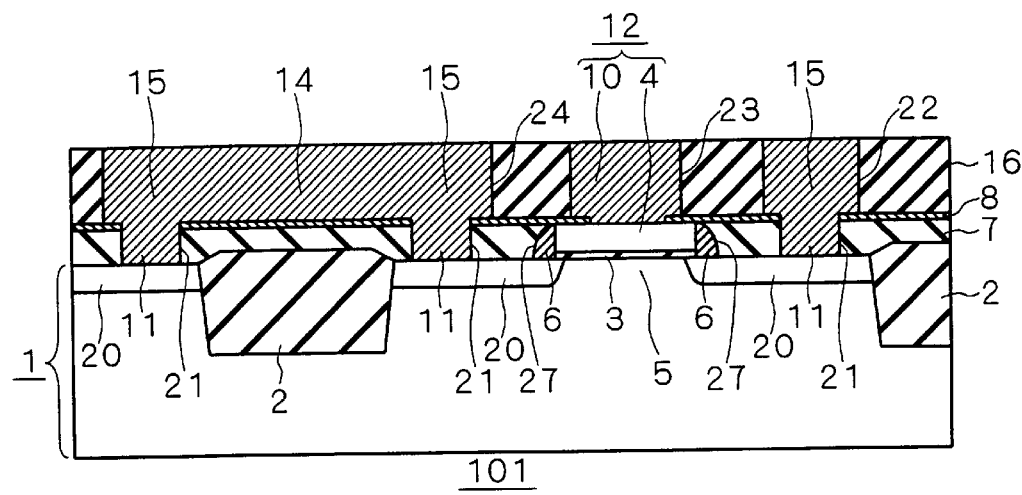
FIGS. 1 and 2 are sectional views showing a device according to a first embodiment.
Figure 20:
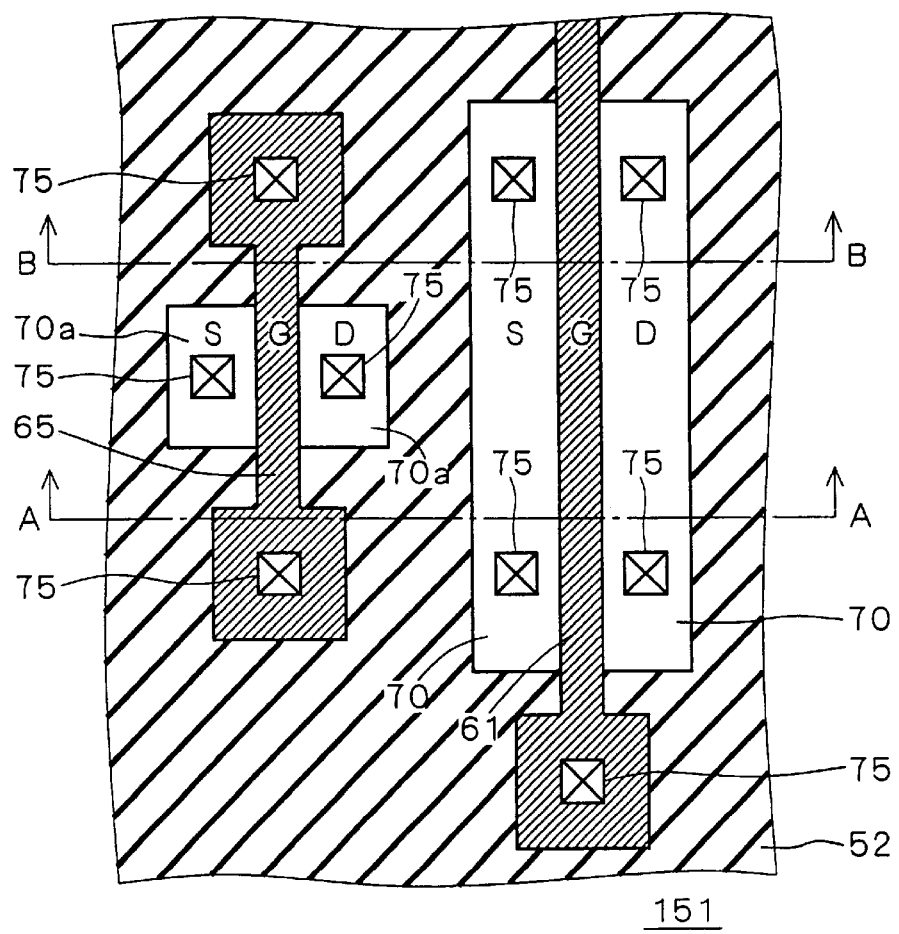
FIG. 20 is a sectional plan view showing the first conventional device.
Figure 21:
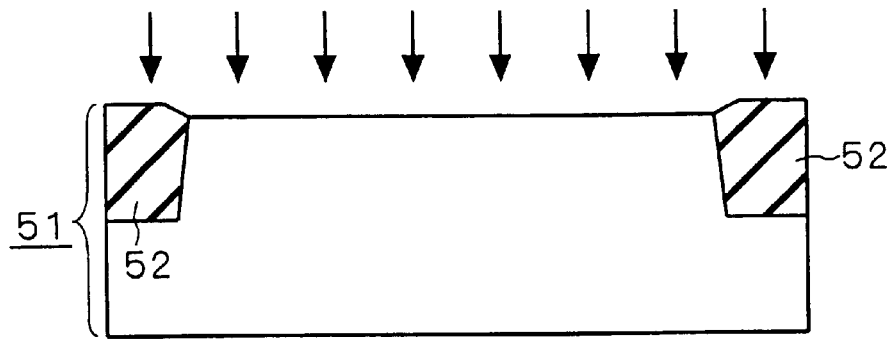
FIGS. 21 to 26 are views showing the steps of manufacturing the first conventional device.
Figure 22:
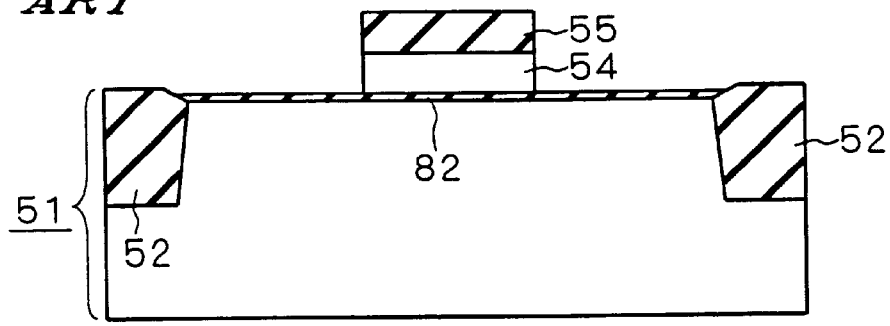
Figure 23:
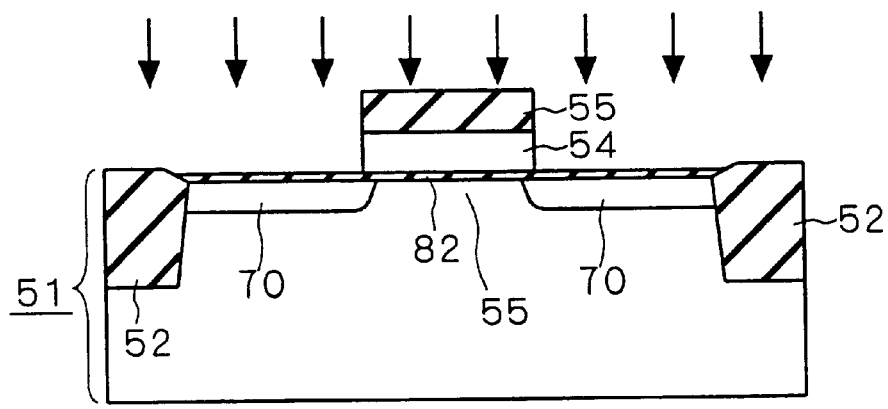
Figure 24:
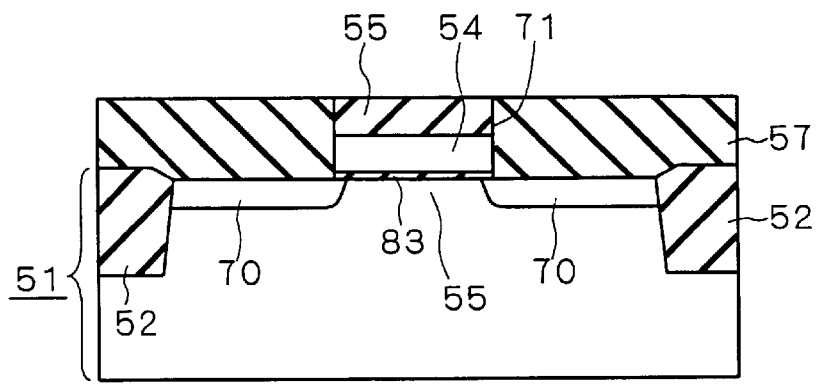
Figure 25:
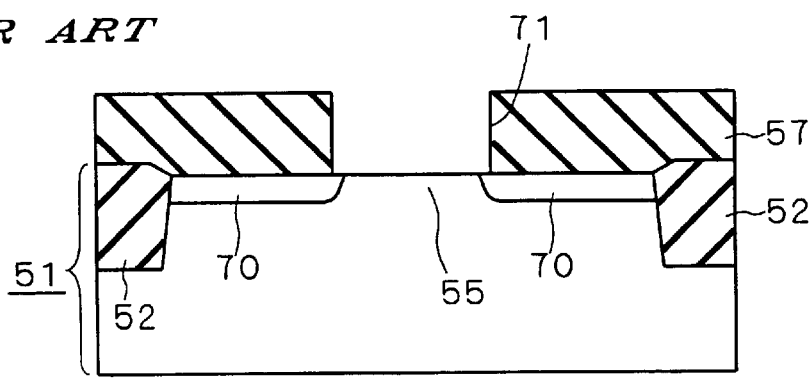
Figure 26:
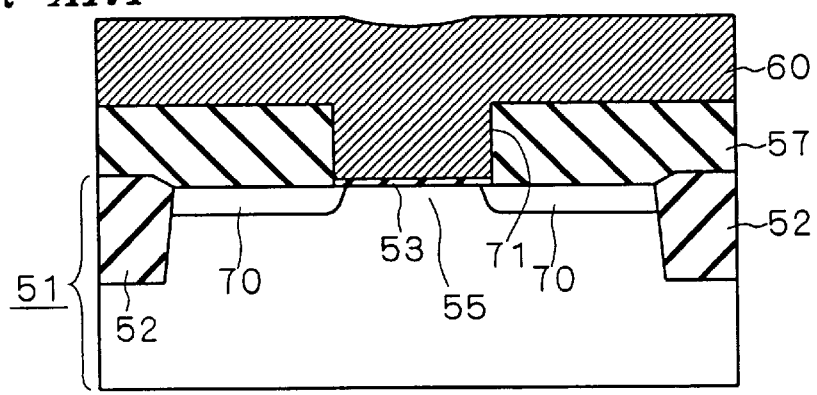
Figure 27:
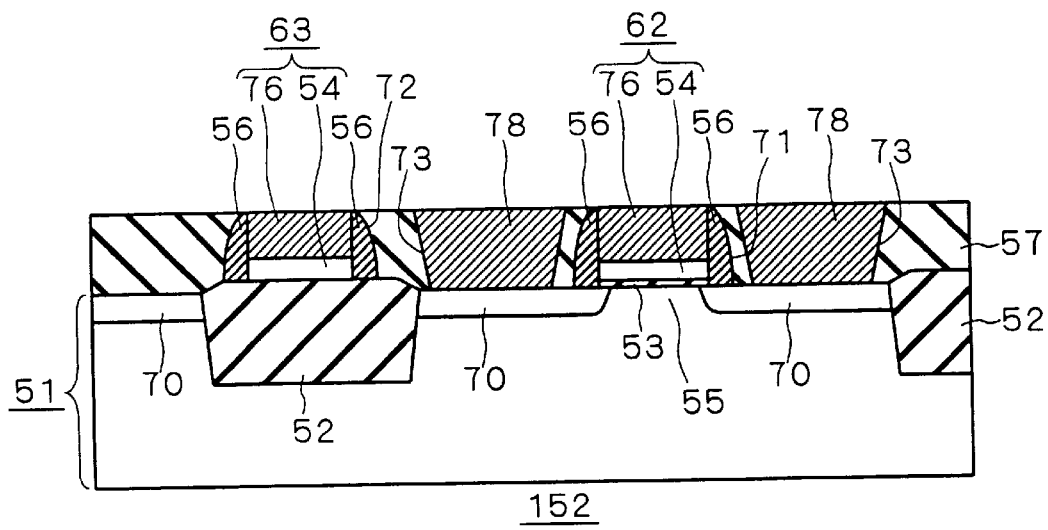
FIG. 27 is a vertical sectional view showing a second conventional device.
Figure 28:
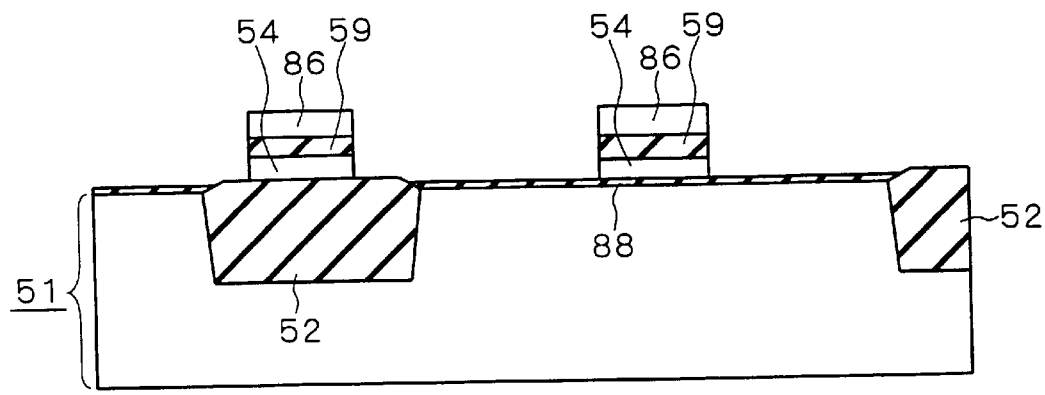
FIGS. 28 to 32 are views showing the steps of manufacturing the second conventional device.
Figure 29:
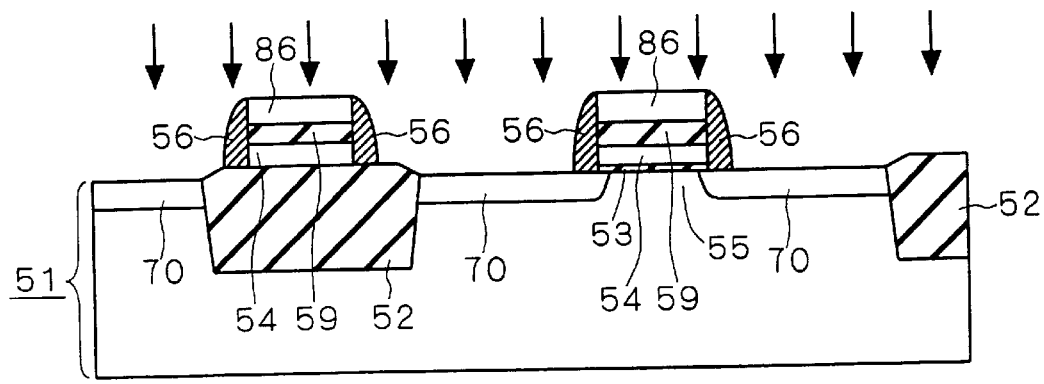
Figure 30:
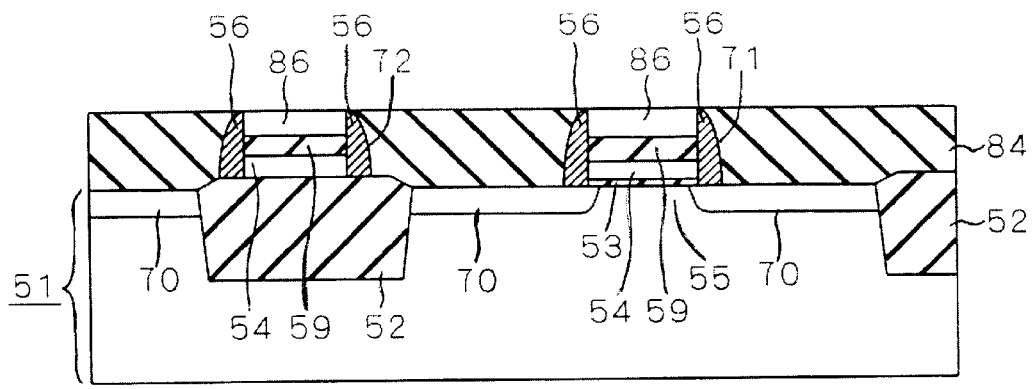
Figure 31:
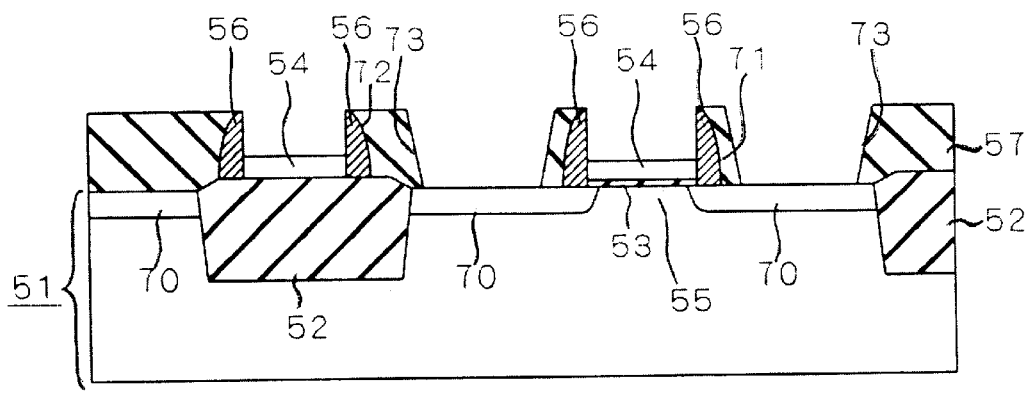
Figure 32:
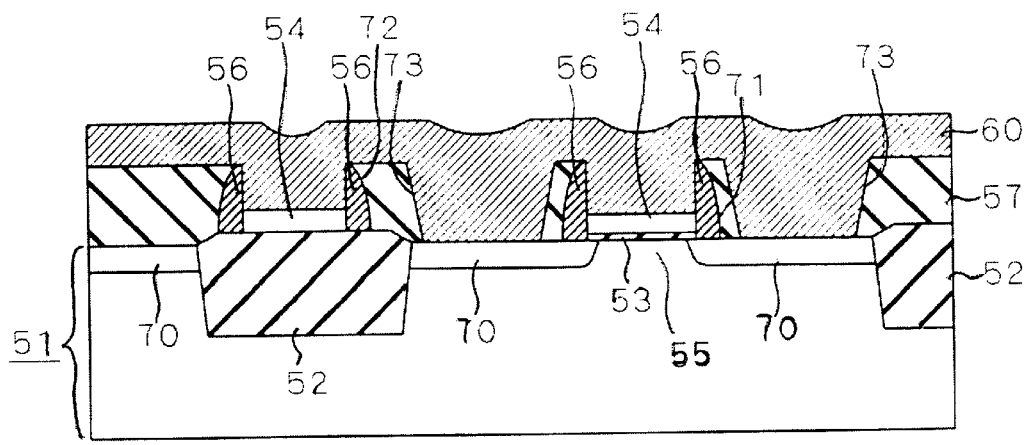

FIG. 1 is a sectional view showing a structure of the semiconductor device according to the preferred embodiment. A semiconductor device 101 comprises a semiconductor substrate 1 made of single crystal silicon which has a main surface. In the same manner as in the semiconductor substrate 51 of each of the conventional semiconductor devices 151 and 152, a plurality of element regions are set in the main surface of the semiconductor substrate 1 and a MOSFET is built in each of the element regions. The arrangement of the element regions is illustrated in the same way as in FIG. 20, for example. While an example in which the semiconductor substrate 1 is made of the most typical silicon as a base material will be taken in the following description including a second embodiment, the present invention is not restricted thereto.

An element isolating film 2 is selectively formed as a trench type element isolating region on an area between the element regions in the main surface of the semiconductor substrate 1. The semiconductor substrate 1 and the element isolating film 2 are covered with an insulating layer 7 functioning as a mold in a manufacturing process. The insulating layer 7 is formed as a silicon oxide film, for example.

A gate insulating film 3 is selectively formed by a silicon oxide film, for example, on the main surface of the semiconductor substrate 1, and a conductive layer 4 formed of a polysilicon layer which is doped with an impurity is provided on the gate insulating film 3. The conductive layer 4 constitutes a gate lower electrode as a part of a gate electrode 12. A side wall 6 is formed by silicon oxide, for example, on a side face of the conductive layer 4. An opening 27 penetrating from an upper surface to a lower surface is selectively provided in the insulating layer 7. The gate insulating film 3, the conductive layer 4 and the side wall 6 are accommodated in the opening 27.

In each of the element regions, the semiconductor substrate 1 is provided with a channel region 5 selectively exposed to the main surface and a pair of source/drain regions 20 selectively exposed to the main surface with the channel region 5 interposed therebetween. The channel region 5 is opposed to the conductive layer 4 through the gate insulating film 3. Moreover, the gate insulating film 3 and the element isolating film 2 are connected integrally with each other, and the conductive layer 4 is provided across both of the gate insulating film 3 and the element isolating film 2 (see FIG. 20). The side wall 6 is formed in connection with the side face of the conductive layer 4 provided across both of the gate insulating film 3 and the element isolating film 2.

Furthermore, an opening 21 penetrating from an upper surface to a lower surface is selectively provided in the insulating layer 7 over the source/drain region 20. A metal layer 11 is buried in the opening 21. The metal layer 11 functions as a plug for electrically connecting the source/drain region 20 to other portions. The metal layer 11 is made of tungsten as a principal component, for example.

The openings 21 and 27 provided in the insulating layer 7 include a plurality of portions separated from each other. For example, the openings 21 and 27 are formed separately from each other, and the openings 21 are separated from each other and the openings 27 are separated from each other in the element regions which are different from each other.

An insulating layer 8 formed of a material which is different from a material of the insulating layer 7, for example, silicon nitride is provided on the insulating layer 7. An opening penetrating from an upper surface to a lower surface is selectively provided in the insulating layer 8 to communicate with the openings 21 and 27 provided in the insulating layer 7. The insulating layer 8 functions as a shield for selectively etching the insulating layer 7 provided thereunder in the manufacturing process.

On the insulating layer 8 is provided an insulating layer 16 formed of a material which is different from the material of the insulating layer 8, and preferably, which is the same as the material of the insulating layer 7. Openings 22, 23 and 24 penetrating from an upper surface to a lower surface are selectively provided in the insulating layer 16, and function as molds in the manufacturing process. The openings 22, 23 and 24 are formed to include the opening provided in the insulating layer 8 and to cause at least one set of a plurality of portions included in the openings 21 and 27 provided in the insulating layer 7 and separated from each other to communicate with each other.

In the example of FIG. 1, the opening 22 communicates with the opening 21, the opening 23 communicates with the opening 27 and the opening 24 communicates with another opening 21. Furthermore, the opening 24 is provided on the source/drain region 20 belonging to element regions which are different from each other such that the two openings 21 provided separately from each other communicate with each other.

Metal layers 10, 14 and 15 made of the same material as the material of the metal layer 11 are buried in the opening provided in the insulating layer 8 and the openings 22, 23 and 24 provided in the insulating layer 16. The metal layers 14 and 15 are connected integrally with the metal layer 11. The metal layer 10 is connected to an upper surface of the conductive layer 4 to constitute a gate upper electrode acting as a part of the gate electrode 12. The metal layer 15 is a portion to be connected to an upper surface of the metal layer 11. Moreover, the metal layer 14 is a portion for connecting the metal layers 11 belonging to the separate element regions through the metal layer 15. Thus, separate portions are electrically connected to each other with a height of the gate upper electrode 10 in the semiconductor device 101.

Figure 2:
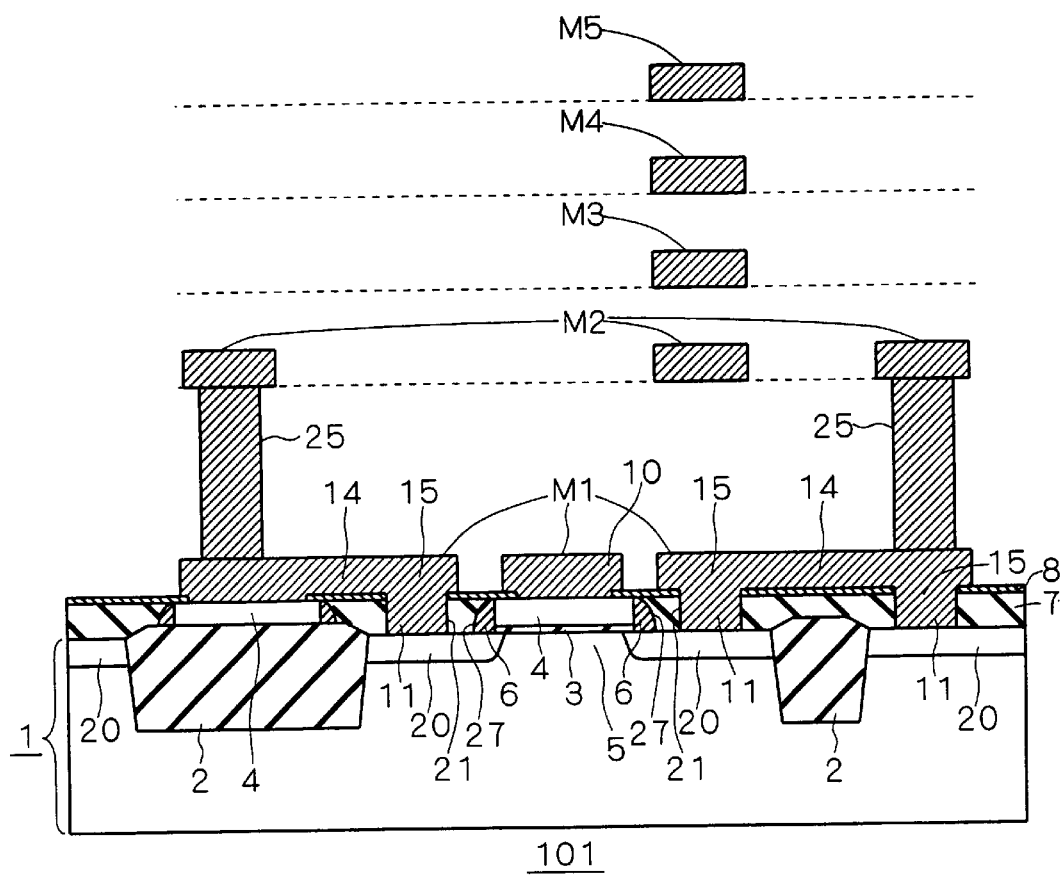

The separate portions to be electrically connected through the metal layer 14 having the same height as the height of the gate upper electrode 10 are not restricted to portions belonging to the element regions which are different from each other. FIG. 2 shows an example in which a gate electrode 4 and a source/drain region 20 are included as separate portions to be electrically connected through the metal layer 14.

Figure 33:
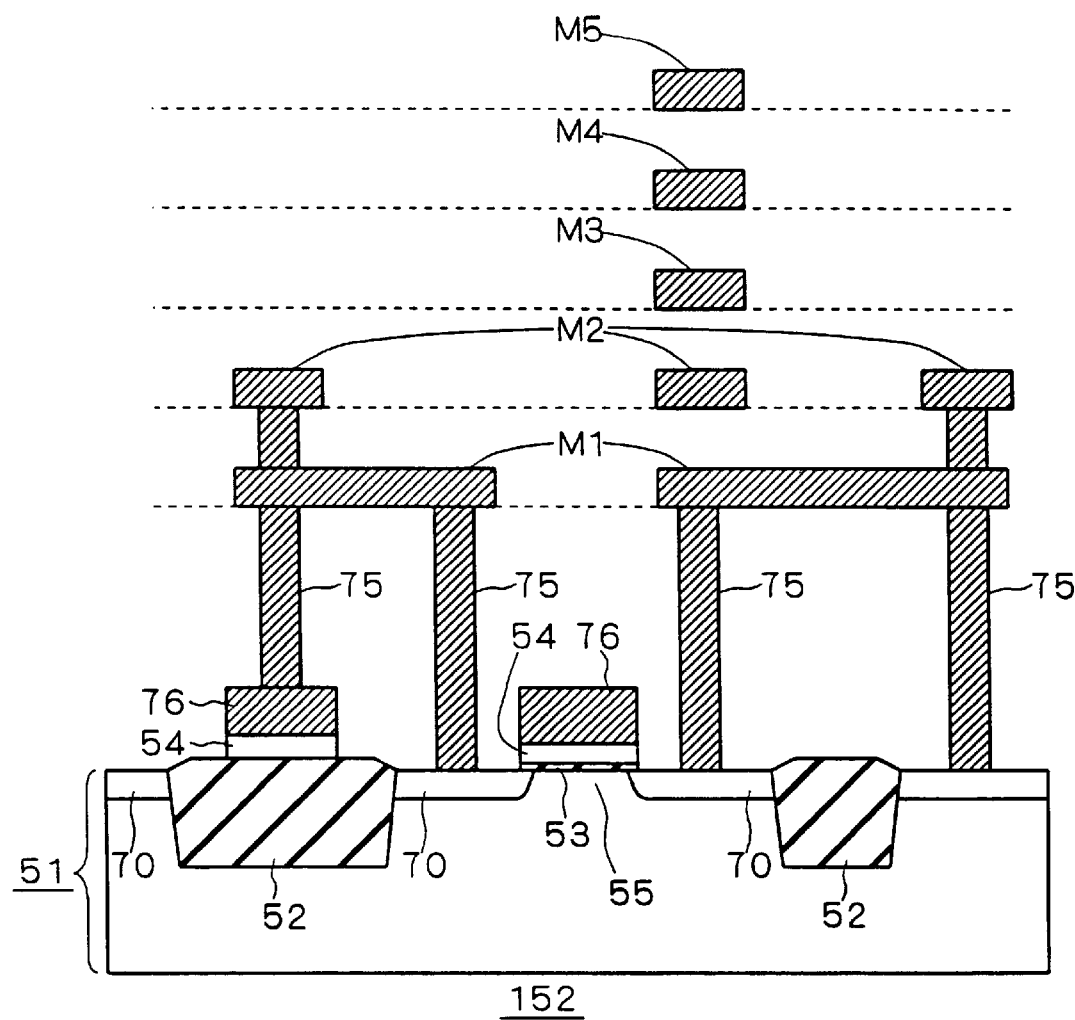
FIGS. 33 and 34 are vertical sectional views illustrating problems of the conventional device.
Figure 34:
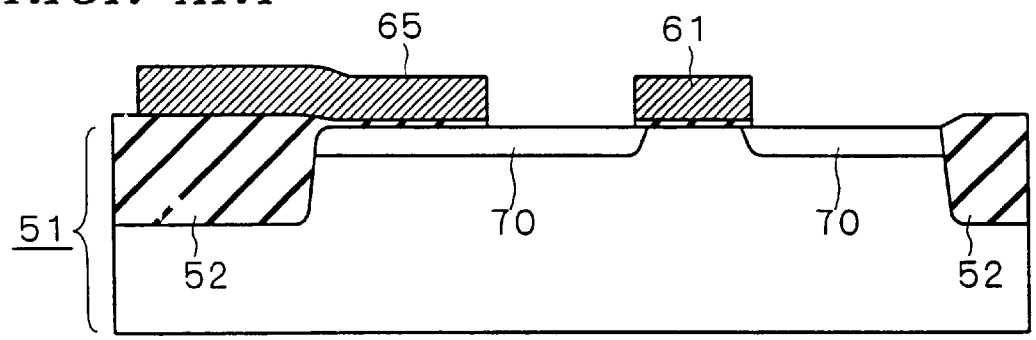

As shown in FIG. 2, the metal layer 14 constitutes a first wiring layer M1 in the semiconductor device 101. More specifically, the first wiring layer M1 is provided with the same height as the height of the gate upper electrode 10. As is apparent from a comparison with FIG. 33, therefore, close portions are connected through an effectively short wiring. Consequently, a wiring delay is reduced more than in a conventional device. Moreover, multilayered wiring layers M2 to M5 connected through a wiring material buried in a contact hole 25 are reduced by one layer as compared with the wiring layers M1 to M5 of the conventional device. Consequently, a manufacturing cost can be reduced. Alternatively, it is also possible to enlarge a degree of freedom on a layout without reducing one layer, thereby reducing a size of the semiconductor substrate 1, that is, a chip size.

Furthermore, the upper surface of the insulating layer 16 and the upper surfaces of the metal layers 14 and 15 are flat as shown in FIG. 1, and are positioned with the same height from the main surface of the semiconductor substrate 1. Moreover, it is sufficient that the contact hole 25 is formed on the upper surfaces of the metal layers 14 and 15 which are made of the same material and have the same height. In the same manner as in the conventional device 152, therefore, it is possible to eliminate technical difficulties with which the contact hole 25 is formed.

(1.2. Method for Manufacturing Device)

FIGS. 3 to 10 are views showing the steps of a method for manufacturing the semiconductor device 101. While an example in which an n-channel MOSFET (NMOSFET) is manufactured as a semiconductor element included in the semiconductor device 101 will be described below, it is also possible to manufacture a p-channel MOSFET (PMOSFET) or a complementary MOSFET (CMOSFET). In order to manufacture the PMOSFET, it is preferable that a conductivity type of an impurity acting as a dopant should be reverse to a conductivity type in a method for manufacturing the NMOSFET. In order to manufacture the CMOSFET, moreover, it is preferable that the NMOSFET and the PMOSFET should be manufactured by selectively performing doping using well-known photolithography.

In general, furthermore, it is also possible to manufacture a semiconductor element having a MOS structure, that is, a semiconductor element having an insulating gate as a semiconductor element included in the semiconductor device 101 as well as a MOSFET. It is preferable that a conventional well-known method should be applied to a portion of the semiconductor element which excludes the MOS structure.

Figure 3:
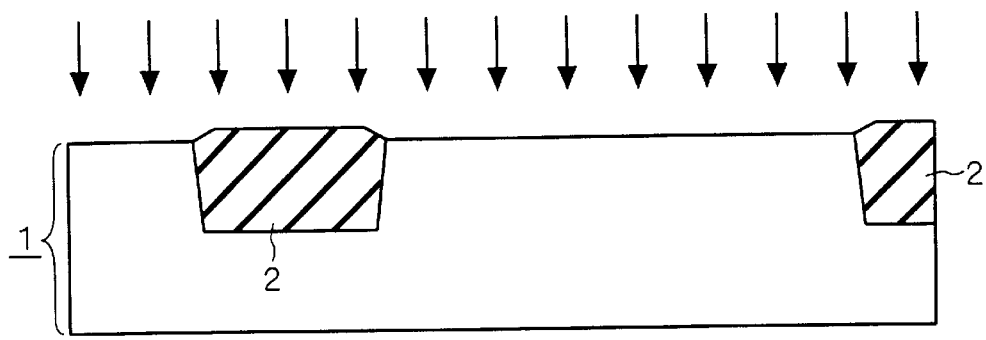
FIGS. 3 to 10 are views showing the steps of manufacturing the device according to the first embodiment.

In order to manufacture the semiconductor device 101, first of all, the step of FIG. 3 is executed. At the step of FIG. 3, a semiconductor substrate 1 made of single crystal silicon which has a main surface is first prepared. Next, a trench type element isolating film 2 is selectively formed on the main surface of the semiconductor substrate 1. The element isolating film 2 is an insulating film for isolating elements and is selectively formed on an area between a plurality of element regions which are set along the main surface. Then, boron ions are implanted into the main surface of the semiconductor substrate 1. Consequently, a p type well is formed and doping for threshold voltage regulation is carried out at the same time.

Figure 4:
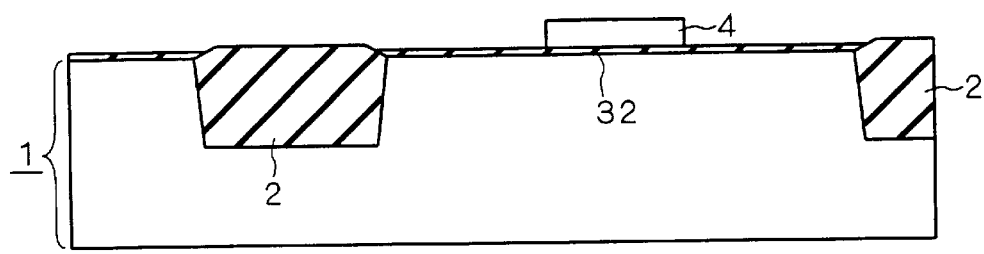

At the step of FIG. 4, first of all, a thermal oxidation treatment is carried out. Consequently, an insulating film 32 which is a silicon oxide film is formed on the main surface of the semiconductor substrate 1. The insulating film 32 is formed in a thickness of about 3 nm to 10 nm, for example. Then, polysilicon is deposited as a conductive material on the insulating film 32 and the element isolating film 2 by using a CVD method. The polysilicon is deposited in a thickness of about 50 nm to 200 nm, for example. Next, the polysilicon is subjected to patterning by using photolithography and anisotropic etching. Consequently, a conductive layer 4 is formed as a gate lower electrode. The conductive layer 4 is formed above a channel region 5 (FIG. 1) which is selectively set for each of the element regions, and is selectively formed above the element isolating film 2.

Figure 5:
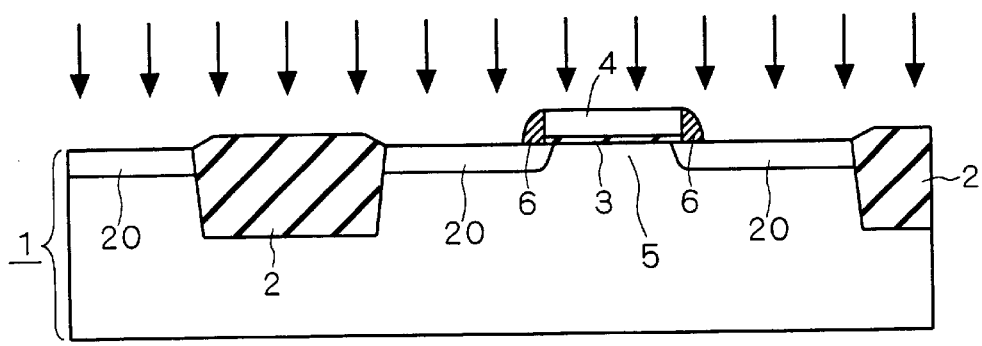

At the step of FIG. 5, arsenic ions are selectively implanted into the main surface of the semiconductor substrate 1 by using the conductive layer 4 as a shield, thereby forming a pair of n type LDD regions (not shown) which are selectively exposed to the main surface. The arsenic ions are implanted at an energy of 5 keV to 30 keV and an angle of incidence of 30° to 70° with a normal of the main surface, for example.

Then, a side wall 6 is formed on a side face of the conducive layer 4. A material of the side wall 6 is silicon nitride, for example. Subsequently, the arsenic ions are selectively implanted into the main surface of the semiconductor substrate 1 by using the conductive layer 4 and the side wall 6 as shields, thereby forming a pair of n type source/drain regions 20 which are selectively exposed to the main surface. The arsenic ions are implanted at an energy of 10 keV to 50 keV and an angle of incidence of 10° or less perpendicularly to the main surface or with the normal of the main surface, for example.

A portion which is interposed between the pair of source/drain regions 20 and is selectively exposed to the main surface under the conductive layer 4 corresponds to a channel region 5. A pair of source/drain regions 20 and a pair of LDD regions are formed for each of the element regions as well as the channel region 5.

Before, during or after the step of FIG. 5, a portion of the insulating film 32 which is not covered with the conductive layer 4 or which is covered with neither the conductive layer 4 nor the side wall 6 is selectively removed.

Figure 6:
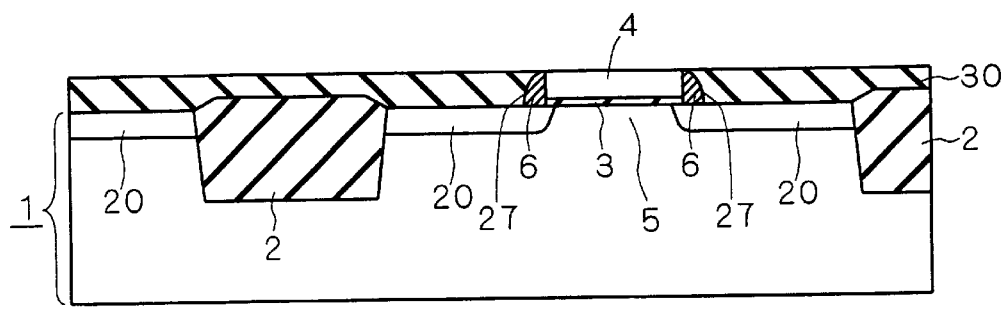

At the step of FIG. 6, first of all, a heat treatment is carried out, thereby activating a dopant introduced into the source/drain region 20. Then, a CVD method is executed to deposit an insulating material over the whole upper surface of a product obtained in this stage. The insulating material is silicon oxide, for example, and is deposited in a thickness of about 200 nm to 400 nm, for example. Subsequently, a CMP method is executed to polish the insulating material until an upper surface of the conductive layer 4 is exposed. As a result, an insulating layer 30 having an upper surface flattened is formed as shown in FIG. 6. The insulating layer 30 selectively defines an opening 27 penetrating from an upper surface to a lower surface. The conductive layer 4 and the side wall 6 are buried in the opening 27. An upper surface of the insulating layer 30 is arranged on a level with that of the conductive layer 4.

Figure 7:
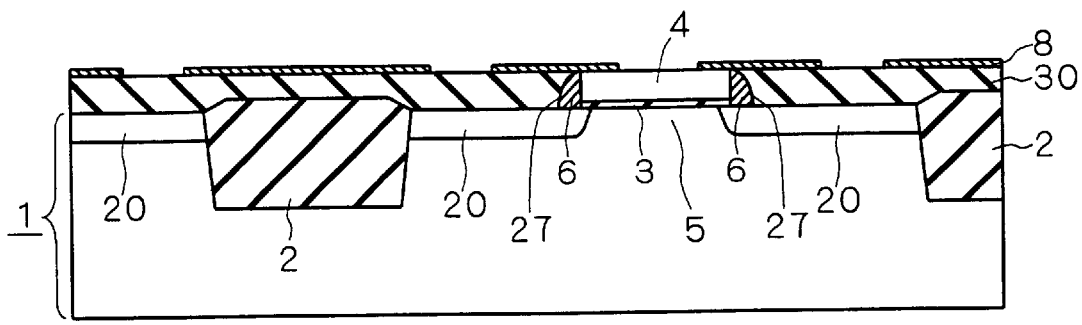

At the step of FIG. 7, subsequently, the CVD method is executed. Consequently, an insulating material is deposited to cover the insulating layer 30 and the conductive layer 4. The insulating material is different from a material of the insulating layer 30, for example, silicon nitride. Moreover, the insulating material is deposited in a thickness of about 20 nm to 100 nm, for example. Subsequently, the deposited insulating material is subjected to patterning by using photolithography and dry etching. Consequently, an insulating layer 8 having a predetermined opening penetrating from an upper surface to a lower surface is formed. The opening provided in the insulating layer 8 is divided into a plurality of portions such that it is selectively opened above the conductive layer 4 and the source/drain region 20.

Figure 8:
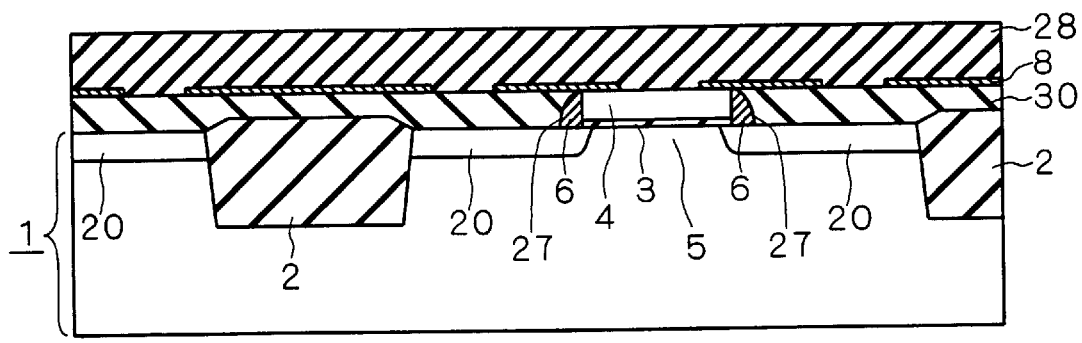

At the step of FIG. 8, next, the CVD method is executed to deposit an insulating layer 28 over the whole upper surface of a product obtained in this stage. Consequently, the insulating layer 30, the insulating layer 8 and the conductive layer 4 are covered with the insulating layer 28. The insulating layer 28 is formed of a material which is different from a material of the insulating layer 8, and preferably, which is the same as the material of the insulating layer 30, for example, silicon oxide. Moreover, the insulating layer 28 is deposited in a thickness of about 200 nm to 400 nm, for example.

Figure 9:
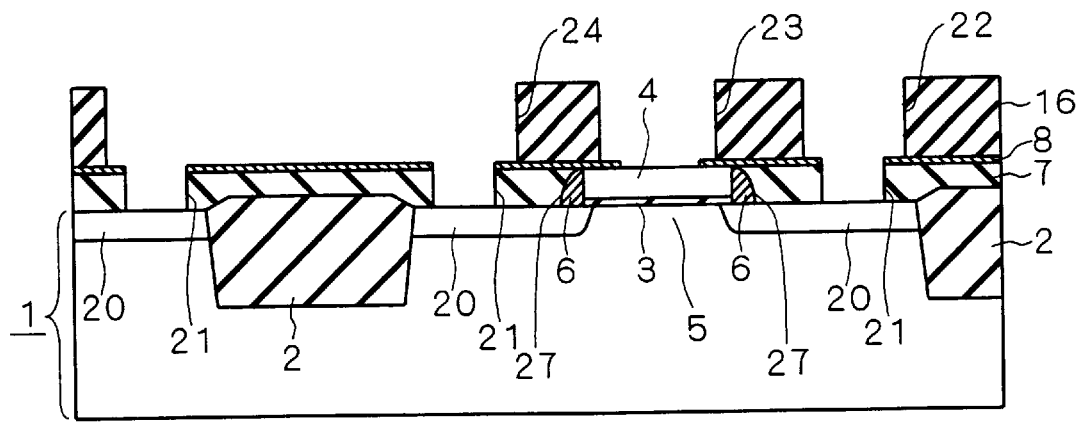

At the step of FIG. 9, subsequently, the insulating layer 28 is subjected to patterning by using the photolithography and the dry etching. Consequently, an insulating layer 16 selectively having openings 22, 23 and 24 which penetrate from an upper surface to a lower surface is formed. At this time, etching having etching selectivity for the insulating layer 30 and the insulating layer 28 against the insulating layer 8 and the conductive layer 4, that is, etching which does not substantially act on the insulating layer 8 and the conductive layer 4 but effectively acts on the insulating layer 30 and the insulating layer 28 is employed.

Moreover, the openings 22, 23 and 24 are formed to include the opening provided in the insulating layer 8. As a result, the etching also progresses for the insulating layer 30 as well as the insulating layer 28. The insulating layer 8 acts as a shield so that the etching for the insulating layer 30 selectively progresses under the opening provided in the insulating layer 8. Consequently, the insulating layer 30 is provided with an opening 21 which reaches the main surface of the semiconductor substrate 1 and is selectively opened on the source/drain region 20. Thus, an insulating layer 7 is formed.

Furthermore, the openings 22, 23 and 24 are formed to connect at least one set of the portions of the opening provided on the insulating layer 8 which are separated from each other. In FIG. 9, the opening 24 connects one set of the portions of the opening provided in the insulating layer 8 which are separated from each other.

Figure 10:
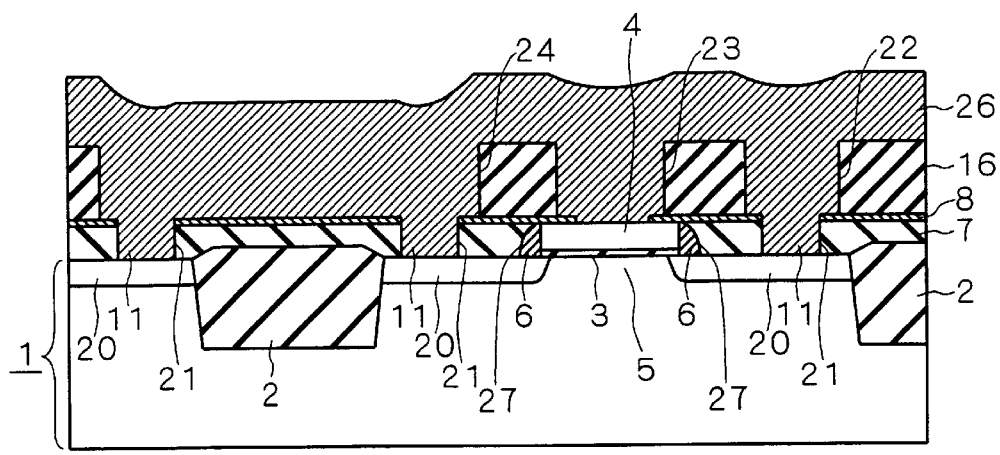

At the step of FIG. 10, subsequently, a CVD method or a sputtering method is executed so that a barrier metal (not shown) is formed over the whole upper surface of a product obtained in this stage. More specifically, the barrier metal is formed on inside surfaces of the openings of the insulating layers 7, 8 and 16 (including the main surface of the semiconductor substrate 1 which is exposed as a bottom face and the upper surface of the conductive layer 4) and the upper surface of the insulating layer 16. The barrier metal is formed by depositing tungsten nitride in a thickness of 20 nm to 100 nm, for example.

Then, a metal is deposited on the barrier metal by using the CVD method or the sputtering method. Consequently, a metal layer 26 is formed. The metal layer 26 is formed to fill in the openings of the insulating layers 7, 8 and 16 and to cover the upper surface of the insulating layer 16. The metal layer 26 is formed by depositing tungsten in a thickness of about 400 nm to 1000 nm, for example.

Next, an upper surface of the metal layer 26 is flattened by executing a CMP method until the insulating layer 16 is exposed. As a result, the metal layer 26 is caused to remain as metal layers 11, 14 and 15 only in the openings of the insulating layers 7, 8 and 16 acting as molds. Thus, the structure shown in FIG. 1 is completed. Upper surfaces of the metal layers 14 and 15 are arranged on a level with the upper surface of the insulating layer 16. As shown in FIG. 2, then, multilayered wiring layers M2 to M5 and insulating layers for insulating them from one another are formed. Thus, the semiconductor device 101 is completed.

While the silicon oxide has been exemplified as the materials of the insulating layers 7 and 16 in the above description, it is also possible to use an insulating material having a lower dielectric constant than a dielectric constant of the silicon oxide. Although the tungsten nitride film has been exemplified as the barrier metal, a metal nitride film such as a titanium nitride film, a tantalum nitride film or the like may be used. Furthermore, while tungsten has been exemplified as the material of the metal layer 26, other metals such as aluminum can also be used.

(2. Second Embodiment)

Figure 11:
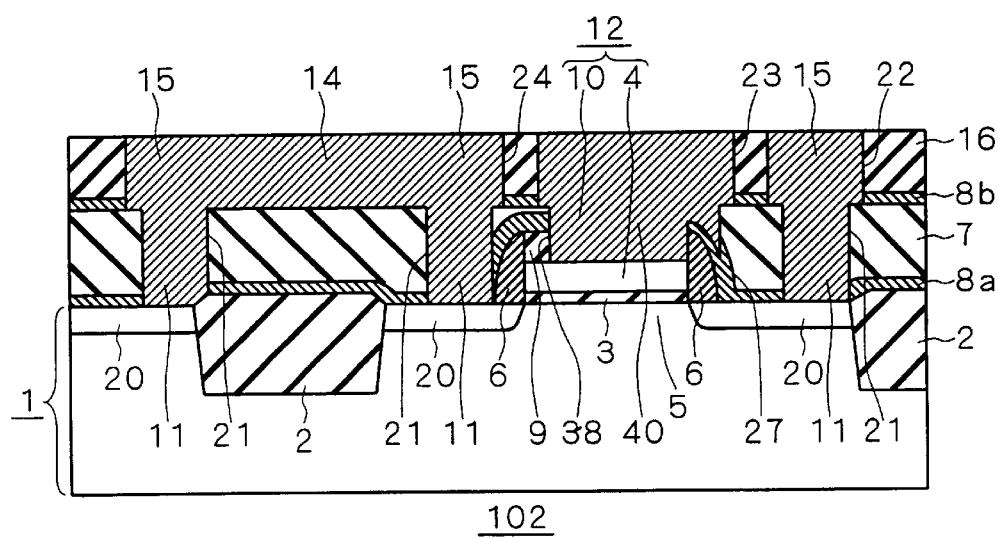
FIG. 11 is a sectional view showing a device according to a second embodiment.

Next, a semiconductor device according to a second embodiment will be described. FIG. 11 is a sectional view showing a structure of the semiconductor device according to the second embodiment. A semiconductor device 102 is characteristically different from the semiconductor device 101 according to the first embodiment in that an insulating layer 8a is provided under an insulating layer 7 and on a main surface of a semiconductor substrate 1 and an element isolating film 2 and that an upper surface of the insulating layer 7 is positioned higher than an upper surface of a conductive layer 4 on the basis of the main surface of the semiconductor substrate 1.

An insulating layer 8b is the same as the insulating layer 8 of the semiconductor device 101 except that it is opened under metal layers 14 and 15 for reasons of a manufacturing process. The insulating layer 8a is formed of a material which is different from materials of the insulating layer 7 and an insulating layer 16, and preferably, which is the same as a material of the insulating layer 8b, for example, silicon nitride. As shown in FIG. 11, moreover, a part of an insulator 9 to be used in the manufacturing process to set the upper surface of the insulating layer 7 higher than the upper surface of the conductive layer 4 remains as a by-product on the conductive layer 4 in some cases. The insulator 9 is formed of a material which is different from the materials of the insulating layers 8a and 8b, for example, silicon oxide.

Furthermore, the insulating layer 8a remains as a by-product between the insulating layer 7 and a side wall 6 and between the insulating layer 7 and the insulator 9 as well as on the main surface of the semiconductor substrate 1 which is positioned under the insulating layer 7 and on the element isolating film 2. More specifically, the insulating layer 8a is provided to cover a portion formed under the insulating layer 7.

Also in the semiconductor device 102, a metal layer 14 can constitute a first wiring layer M1 (FIG. 2) and a contact hole 25 (FIG. 2) can be formed on upper surfaces of the metal layers 14 and 15 which are made of the same material and have the same height in the same manner as in the semiconductor device 101 according to the first embodiment. Therefore, the same effects as in the semiconductor device 101 can be obtained. Advantages peculiar to the semiconductor device 102 which are derived from the insulating layer 8a and the insulator 9 will be described in the following explanation for a manufacturing method.

FIGS. 12 to 18 are views showing the steps of a method for manufacturing the semiconductor device 102. While description will be given to an example in which an n-channel MOSFET (NMOSFET) is manufactured as a semiconductor element included in the semiconductor device 102 in the same manner as in the manufacturing method according to the first embodiment, a p-channel MOSFET (PMOSFET) or a complementary MOSFET (CMOSFET) can also be manufactured. Moreover, it is generally possible to manufacture a semiconductor element having a MOS structure as well as the MOSFET.

Figure 12:
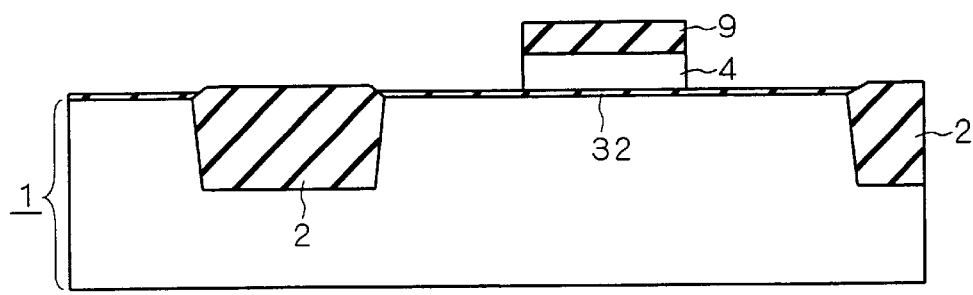

In order to manufacture the semiconductor device 102, first of all, the step of FIG. 3 according to the first embodiment is executed, and the step of FIG. 12 is then executed. At the step of FIG. 12, first of all, a thermal oxidation treatment is carried out. Consequently, an insulating film 32 which is a silicon oxide film is formed on a main surface of a semiconductor substrate 1. The insulating film 32 is formed in a thickness of about 3 nm to 10 nm, for example. Then, polysilicon acting as a conductive material and an insulating material are deposited on the insulating film 32 and an element isolating film 2 by using a CVD method. The polysilicon is deposited in a thickness of about 50 nm to 200 nm, for example. Moreover, the insulating material is silicon oxide which is deposited in a thickness of about 50 nm to 200 nm, for example.

Next, the insulating material is subjected to patterning by using photolithography and anisotropic etching, thereby forming an insulator 9 as a dummy gate electrode. Furthermore, the polysilicon is subjected to anisotropic etching by using the insulator 9 as a shield. Consequently, a conductive layer 4 is formed as a gate lower electrode under the insulator 9. The conductive layer 4 and the insulator 9 are formed above a channel region 5 (FIG. 11) which is selectively set for each of a plurality of element regions, and is also formed selectively on the element isolating film 2.

Figure 13:
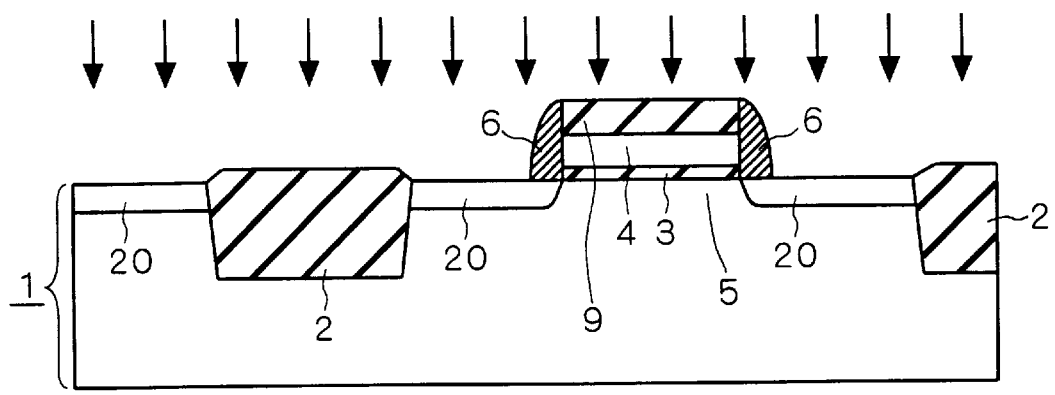

At the step of FIG. 13, arsenic ions are selectively implanted into the main surface of the semiconductor substrate 1 by using the conductive layer 4 and the insulator 9 as shields, thereby forming a pair of n type LDD regions (not shown) which are selectively exposed to the main surface. The arsenic ions are implanted at an energy of 5 keV to 30 keV and an angle of incidence of 30° to 70° with a normal of the main surface, for example.

Then, a side wall 6 is formed on side faces of the conducive layer 4 and the insulator 9. A material of the side wall 6 is silicon nitride, for example. Subsequently, the arsenic ions are selectively implanted into the main surface of the semiconductor substrate 1 by using the conductive layer 4 and the side wall 6 as the shields, thereby forming a pair of n type source/drain regions 20 which are selectively exposed to the main surface. The arsenic ions are implanted at an energy of 10 keV to 50 keV and an angle of incidence perpendicular to the main surface or of 10° or less with the normal of the main surface, for example.

A portion which is interposed between the pair of source/drain regions 20 and is selectively exposed to the main surface under the conductive layer 4 corresponds to a channel region 5. In the same manner as the channel region 5, moreover, a pair of source/drain regions 20 and a pair of LDD regions are formed for each of the element regions.

Before, during or after the step of FIG. 13, a portion of the insulating film 32 which is not covered with the conductive layer 4 or which is covered with neither the conductive layer 4 nor the side wall 6 is selectively removed.

Figure 14:
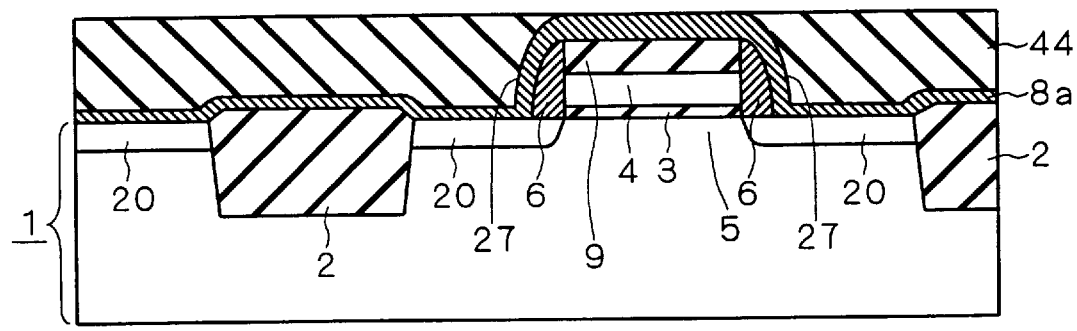

At the step of FIG. 14, first of all, a heat treatment is carried out, thereby activating a dopant introduced into the source/drain region 20. Then, a CVD method is executed to deposit an insulating layer 8a over the whole upper surface of a product obtained in this stage. The insulating layer 8a is formed by depositing a material which is different from a material of the insulator 9, for example, silicon nitride in a thickness of about 20 nm to 60 nm.

Thereafter, the CVD method is executed to deposit an insulating material over the whole upper surface of a product obtained in this stage. The insulating material is formed of a material which is different from the material of the insulating layer 8a, for example, silicon oxide. The insulating material is deposited in a thickness of about 200 nm to 400 nm, for example, to also cover a portion of the insulating layer 8a which is positioned on the insulator 9. Subsequently, a CMP method is executed to polish the insulating material until an upper surface of the insulating layer 8a is exposed. As a result, an insulating layer 44 having an upper surface flattened is formed as shown in FIG. 14. The insulating layer 44 selectively defines an opening 27 penetrating from an upper surface to a lower surface. The conductive layer 4, the insulator 9, the side wall 6 and a portion of the insulating layer 8a which covers them are buried in the opening 27. An upper surface of the insulating layer 44 is arranged on a level with that of the portion of the insulating layer 8a which is positioned on the insulator 9.

Figure 15:
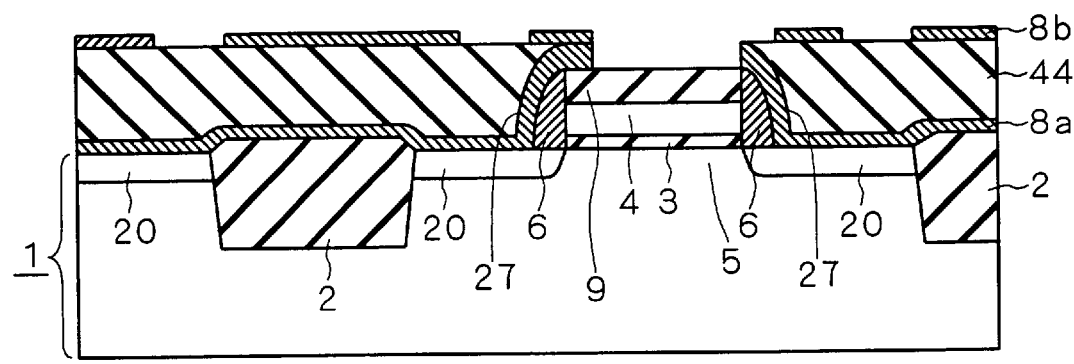
Figure 19:
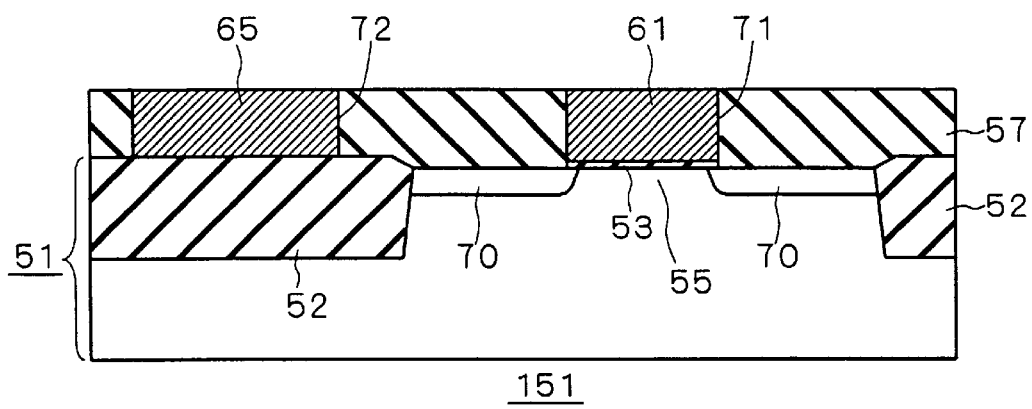
FIG. 19 is a vertical sectional view showing a first conventional device.

At the step of FIG. 15, subsequently, the CVD method is executed. Consequently, an insulating material is deposited to cover the insulating layer 44 and the insulating layer 8a. The insulating material is different from a material of the insulating layer 44, and is preferably the same as the material of the insulating layer 8a, for example, silicon nitride. Moreover, the insulating material is deposited in a thickness of about 20 nm to 60 nm, for example.

Subsequently, the deposited insulating material is subjected to patterning by using photolithography and dry etching. Consequently, an insulating layer 8b selectively having a predetermined opening penetrating from an upper surface to a lower surface is formed. At this time, etching having selectivity for the insulating layers 8a and 8b against the insulating layer 44 and the insulator 9 is employed. More specifically, etching which does not substantially act on the insulating layer 44 and the insulator 9 but effectively acts on the insulating layers 8a and 8b is used. As a result, the same opening is formed on both of the insulating layers 8a and 8b over the conductive layer 4. The opening provided on the insulating layer 8b is divided into a plurality of portions such that it is selectively opened above the conductive layer 4 and the source/drain region 20.

At the step of FIG. 16, the CVD method is executed to deposit an insulating layer 46 over the whole upper surface of a product obtained in this stage. Consequently, the insulating layer 44, the insulating layer 8a, the insulating layer 8b and the insulator 9 are covered with the insulating layer 46. The insulating layer 46 is formed of a material which is different from the materials of the insulating layers 8a and 8b, and is preferably formed of the same material as the material of the insulating layer 44, for example, silicon oxide. Moreover, the insulating layer 46 is deposited in a thickness of about 200 nm to 400 nm, for example.

At the step of FIG. 17, subsequently, the insulating layer 46 is subjected to patterning by using the photolithography and the dry etching. Consequently, an insulating layer 16 selectively having openings 22, 23 and 24 penetrating from an upper surface to a lower surface is formed. At this time, etching having etching selectivity for the insulating layers 44 and 46 against the insulating layers 8a and 8b and the conductive layer 4 is employed. More specifically, etching which does not substantially act on the insulating layers 8a and 8b and the conductive layer 4 but effectively acts on the insulating layers 44 and 46 is employed.

Moreover, the openings 22, 23 and 24 are formed to include the opening provided on the insulating layer 8b. As a result, the etching also progresses for the insulating layer 44 as well as the insulating layer 46. The insulating layer 8b acts as a shield so that the etching for the insulating layer 44 selectively progresses under the opening provided in the insulating layer 8b. Consequently, the insulating layer 44 is provided with an opening 21 which reaches the insulating layer 8a and is selectively opened over the source/drain region 20. Thus, an insulating layer 7 is formed. The insulating layer 8a functions as an etching stopper.

The openings 22, 23 and 24 are formed to connect at least one set of the portions of the opening provided in the insulating layer 8b which are separated from one another. In FIG. 17, the opening 24 connects one set of the portions of the opening provided in the insulating layer 8b which are separated from each other.

At the step of FIG. 18, first of all, a dry etching method having etching selectivity for the insulating layer 8a against the semiconductor substrate 1, the conducive layer 4, the insulating layer 7 and the insulating layer 16 is used to selectively remove a portion of the insulating layer 8a which is exposed to the outside in this stage, that is, a portion of the insulating layer 8a which is exposed to the openings of the insulating layer 7 and the insulating layer 16. At this time, an exposed portion of the insulating layer 8b is secondarily removed simultaneously.

Then, a CVD method or a sputtering method is executed so that a barrier metal (not shown) is formed over the whole upper surface of a product obtained in this stage. More specifically, the barrier metal is formed on inside surfaces of the openings of the insulating layers 7, 8a, 8b and 16 (including the main surface of the semiconductor substrate 1 which is exposed as a bottom face and the upper surface of the conductive layer 4) and the upper surface of the insulating layer 16. The barrier metal is formed by depositing tungsten nitride in a thickness of 20 nm to 100 nm, for example.

Thereafter, a metal is deposited on the barrier metal by using the CVD method or the sputtering method. Consequently, a metal layer 42 is formed. The metal layer 42 is formed to fill in the openings of the insulating layers 7, 8a, 8b and 16 and to cover the upper surface of the insulating layer 16. The metal layer 42 is formed by depositing tungsten in a thickness of about 400 nm to 1000 nm, for example.

Next, an upper surface of the metal layer 42 is flattened by executing a CMP method until the insulating layer 16 is exposed. As a result, the metal layer 42 is caused to remain as metal layers 11, 14 and 15 only in the openings of the insulating layers 7, 8a, 8b and 16 acting as molds. Thus, the structure shown in FIG. 11 is completed. Upper surfaces of the metal layers 14 and 15 are arranged on a level with the upper surface of the insulating layer 16. As shown in FIG. 2, then, multilayered wiring layers M2 to M5 and insulating layers for insulating them from one another are formed. Thus, the semiconductor device 102 is completed.

While the silicon oxide has been exemplified as the materials of the insulating layers 7 and 16 in the above description, it is also possible to use an insulating material having a lower dielectric constant than a dielectric constant of the silicon oxide. Although the tungsten nitride film has been exemplified as the barrier metal, a metal nitride film such as a titanium nitride film, a tantalum nitride film or the like may be used. Furthermore, while tungsten has been exemplified as the material of the metal layer 42, other metals such as aluminum can also be used.

In the semiconductor device 102, the insulating layer 8a is provided. Also in the case where errors of a mask alignment occur and a part of the opening 21 to be positioned on the source/drain region 20 is also formed on the element isolating film 2 as illustrated in the left end of FIG. 17 in the manufacturing process of forming the opening 21 on the insulating layer 7 by using the etching, therefore, the element isolating film 2 can be prevented from being inadvertently etched because the insulating layer 8a functions as the etching stopper. Consequently, it is possible to prevent a deterioration in junction characteristics of the source/drain region 20 or a short circuit between a portion of the semiconductor substrate 1 other than the source/drain region 20 and the metal layer 11. More specifically, the precision of the mask alignment in the manufacturing process can be relieved. Consequently, the cost of the semiconductor device 101 as a product can be reduced and, at the same time, the reliability of the semiconductor device 101 can be enhanced.

Moreover, the insulator 9 is formed. Therefore, there is an advantage that the insulator 9 can be used as a hard mask at the step of selectively removing the deposited polysilicon (FIG. 12).

(3. Variant)

(1) In the manufacturing method according to the first embodiment, the insulator 9 can also be formed on the conductive layer 4 in the same manner as in the second embodiment. Consequently, it is possible to obtain an advantage that the insulator 9 can be used as a hard mask at the step of selectively removing the deposited polysilicon (FIG. 4) in the same manner as in the second embodiment. When this manufacturing method is to be employed, the upper surface of the insulating layer 7 is positioned higher than the upper surface of the conductive layer 4 in the completed semiconductor device 101 in the same manner as in the semiconductor device 102. The method according to the second embodiment has the following advantage. Even if the insulator 9 is formed of the same material as the material of the insulating layer 7, the selectivity for the CMP method is not damaged because the insulating layer 8a is provided on the insulator 9.

(2) In the manufacturing method according to the second embodiment, the insulator 9 may not be formed on the conductive layer 4 in the same manner as in the first embodiment. When this manufacturing method is to be employed, the upper surface of the insulating layer 7 is positioned higher than the upper surface of the conductive layer 4 only by a thickness of the insulating layer 8a in the completed semiconductor device 102.

(3) Since the manufacturing methods according to the variants (1) and (2) and the structure of the completed device are obvious from the explanation of the first and second embodiments, their detailed description will be omitted.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   a) a semiconductor substrate having a main surface; and
   b) a plurality of element regions set along said main surface of said semiconductor substrate, each of said element regions including:
      a channel region selectively provided in said main surface;
      a pair of source/drain regions selectively provided in said main surface with said channel region interposed therebetween;
      a gate insulating film provided on said channel region;
      a conductive layer provided on said gate insulating film;
      a first insulating layer which has a first opening selectively penetrating from an upper surface of said first insulating layer to a lower surface of said first insulating layer over a surface of said pair of source/drain regions, said first insulating layer accommodating said conductive layer;
      a second insulating layer provided on said first insulating layer and formed of a material different from a material of said first insulating layer, the second insulating layer selectively defining a second opening penetrating from an upper surface of said second insulating layer to a lower surface of said second insulating layer so as to communicate with said first opening and a surface of said conductive layer;
      a third insulating layer provided on said second insulating layer and formed of a material different from said material of said second insulating layer, said third insulating layer selectively defining a third opening which is opened to include said second opening in said second insulating layer, said third opening penetrating from an upper surface of said third insulating layer to a lower surface of said third insulating layer so as to communicate with said first and second openings; and
      a metal layer, buried in said first, second and third openings, the metal layer including:
         (1) a gate upper electrode provided on said conductive layer; and
         (2) a wiring layer electrically connected to wiring layers in other of said element regions;
   wherein an upper surface of said first insulating layer is arranged on a level with that of said conductive layer.

2. The semiconductor device according to claim 1, further comprising:
   a fourth insulating layer provided under said first insulating layer, selectively defining a fourth opening formed under said first opening and having said conductive layer and said metal layer buried therein and is formed of a material different from materials of said first and third insulating layers.

3. The semiconductor device according to claim 1, wherein said first insulating layer and said third insulating layer are formed of the same material.

4. The semiconductor device according to claim 2, wherein said second insulating layer and said fourth insulating layer are formed of the same material.

5. The semiconductor device according to claim 1, further comprising:
   an element isolating film which is selectively formed in an area between said element regions in said main surface;
   wherein said conductive layer is also provided on said element isolating film.

6. The semiconductor device according to claim 1, wherein a material of said conductive layer is a polycrystalline semiconductor.

7. The semiconductor device according to claim 1, wherein:
   said semiconductor substrate is a single crystal substrate including silicon as a base material,
   materials of said first and third insulating layers are silicon oxide, and
   a material of said second insulating layer is silicon nitride.

8. The semiconductor device according to claim 1, wherein:
   the wiring layer extends to the same height as the gate upper electrode.

* * * * *